(12) United States Patent
Moon et al.

(10) Patent No.: US 9,842,809 B2
(45) Date of Patent: Dec. 12, 2017

(54) SEMICONDUCTOR PACKAGES HAVING EMI SHIELDING PARTS AND METHODS OF FABRICATING THE SAME

(71) Applicant: SK hynix Inc., Icheon-si, Gyeonggi-do (KR)

(72) Inventors: Ki Ill Moon, Seoul (KR); Myeong Seob Kim, Icheon-si (KR); Hee Min Shin, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 78 days.

(21) Appl. No.: 14/989,246

(22) Filed: Jan. 6, 2016

(65) Prior Publication Data

US 2017/0047293 A1    Feb. 16, 2017

(30) Foreign Application Priority Data

Aug. 10, 2015    (KR) .................. 10-2015-0112607

(51) Int. Cl.
*H01L 23/552*    (2006.01)
*H01L 23/498*    (2006.01)
(Continued)

(52) U.S. Cl.
CPC ...... *H01L 23/552* (2013.01); *H01L 23/49838* (2013.01); *H01L 23/544* (2013.01); *H01L 23/295* (2013.01); *H01L 23/3128* (2013.01); *H01L 23/3135* (2013.01); *H01L 24/06* (2013.01); *H01L 24/16* (2013.01); *H01L 24/48* (2013.01); *H01L 24/49* (2013.01); *H01L 25/0657* (2013.01); *H01L 2223/54406* (2013.01); *H01L 2223/54433* (2013.01); *H01L 2223/54486* (2013.01); *H01L 2224/04042* (2013.01); *H01L 2224/06135* (2013.01); *H01L 2224/16145* (2013.01); *H01L 2224/16227* (2013.01); *H01L 2224/48091* (2013.01); *H01L 2224/48227* (2013.01); *H01L 2224/49171* (2013.01); *H01L 2225/0651* (2013.01);
(Continued)

(58) Field of Classification Search
CPC ................. H01L 23/552; H01L 23/544; H01L 23/49838
See application file for complete search history.

(56) References Cited

U.S. PATENT DOCUMENTS 7,327,015 B2    2/2008 Yang et al.
8,669,646 B2 *  3/2014 Tabatabai .............. H01L 23/552
                                                        257/659
(Continued)

FOREIGN PATENT DOCUMENTS

KR    1020100107540 A    10/2010

*Primary Examiner* — Jose R Diaz
(74) *Attorney, Agent, or Firm* — William Park & Associates Ltd.

(57) ABSTRACT

A semiconductor package may include a semiconductor device mounted on a package substrate, a conductive roof located over the semiconductor device, a plurality of conductive walls disposed on the package substrate and arrayed in a closed loop line surrounding the semiconductor device. Conductive pillars may be disposed in regions between the conductive walls on the package substrate and bonded to the conductive roof. The semiconductor package may include a first dielectric layer filling a space between the package substrate and the conductive roof.

19 Claims, 34 Drawing Sheets

(51) Int. Cl.
*H01L 23/544* (2006.01)
*H01L 23/29* (2006.01)
*H01L 23/31* (2006.01)
*H01L 23/00* (2006.01)
*H01L 25/065* (2006.01)

(52) U.S. Cl.
CPC ............. *H01L 2225/06513* (2013.01); *H01L 2225/06517* (2013.01); *H01L 2225/06541* (2013.01); *H01L 2924/1533* (2013.01); *H01L 2924/15311* (2013.01); *H01L 2924/3025* (2013.01)

(56) References Cited

U.S. PATENT DOCUMENTS

| | | | |
|---|---|---|---|
| 8,963,298 B2 * | 2/2015 | Yao | H01L 23/552 257/659 |
| 2010/0110656 A1 | 5/2010 | Ko et al. | |

* cited by examiner

SEMICONDUCTOR PACKAGES HAVING EMI SHIELDING PARTS AND METHODS OF FABRICATING THE SAME

CROSS-REFERENCE TO RELATED APPLICATION

The present application claims priority under 35 U.S.C. 119(a) to Korean Patent Application No. 10-2015-0112607, filed on Aug. 10, 2015, in the Korean intellectual property Office, which is incorporated herein by reference in its entirety as set forth in full.

BACKGROUND

1. Technical Field

Embodiments of the present disclosure generally relate to semiconductor packages and, more particularly, to semiconductor packages having electromagnetic interference (EMI) shielding parts and methods of fabricating the same.

2. Related Art

Semiconductor chips (also, referred as 'semiconductor dies') including integrated circuits have to be protected from electromagnetic waves that can affect operations of the integrated circuits. In addition, while the semiconductor chips operate, the integrated circuits may generate the electromagnetic waves. The electromagnetic waves may also affect human bodies. That is, the electromagnetic waves generated from the integrated circuits of the semiconductor chips may affect other semiconductor chips, other electronic systems or human bodies to cause malfunction of the other semiconductor chips or the other electronic systems or to cause human diseases. Thus, it may be necessary to shield the semiconductor chips (or the electronic systems) such that the electromagnetic waves or high frequency noises generated from the semiconductor chips (or the electronic systems) are not propagated out.

Recently, wearable electronic devices and mobile devices are increasingly in demand with the development of lighter, smaller, faster, multi-functional, and higher performance electronic systems. Thus, it is becoming more and more important to shield electronic products such as semiconductor packages from electromagnetic interference (hereinafter, referred to as 'EMI').

DETAILED DESCRIPTION

Figure 1:
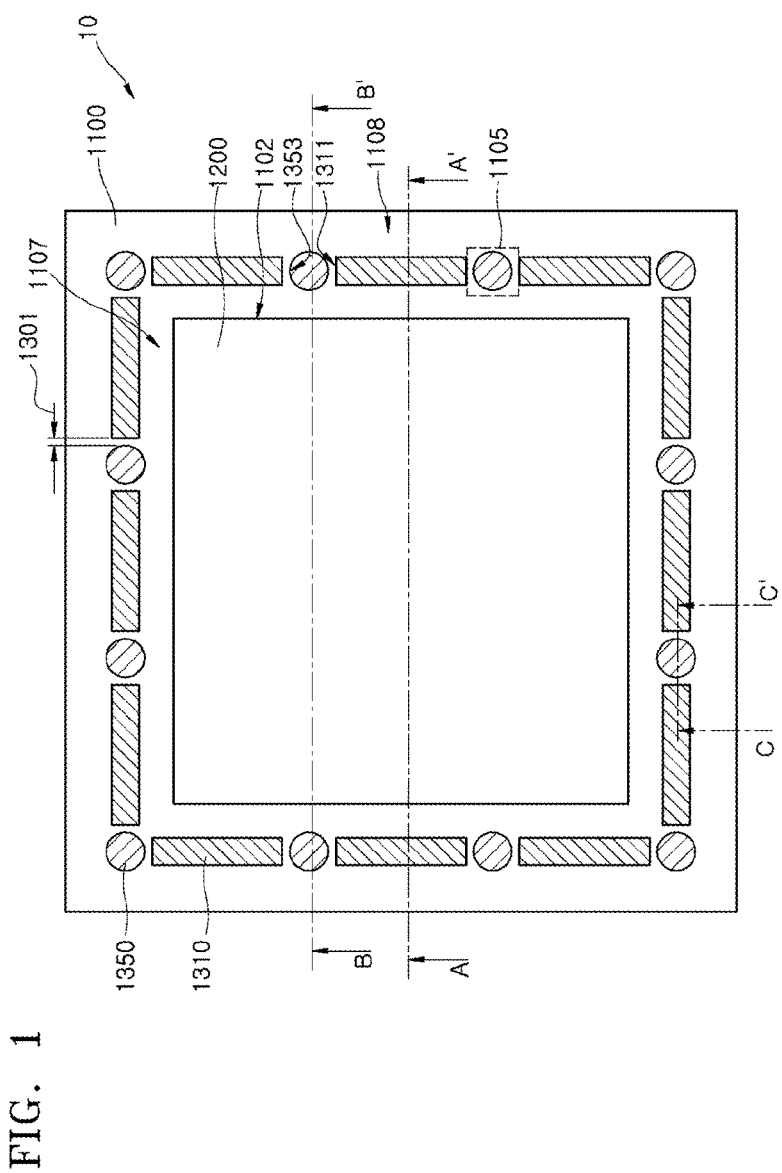
FIGS. 1 to 6 illustrate a representation of an example of a semiconductor package according to an embodiment.

Various embodiments may be directed to semiconductor packages having EMI shielding parts, methods of fabricating the same, electronic systems including the same, and memory cards including the same.

According to an embodiment, a semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed on the package substrate and bonded to the conductive roof. The plurality of conductive pillars may be disposed in regions between the conductive walls to provide interconnecting tunnels corresponding to spaces between the conductive walls and the conductive pillars. A first dielectric layer may fill a space between the package substrate and the conductive roof.

According to an embodiment, a semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed in regions between the conductive walls on the package substrate and bonded to the conductive roof. A first portion of a sidewall of each conductive pillar may be combined with one of the conductive walls by a bridge portion, and a second portion of a sidewall of each conductive pillar may be spaced apart from one of the conductive walls to provide an interconnecting tunnel corresponding to a space. A first dielectric layer may fill a space between the package substrate and the conductive roof.

According to an embodiment, a semiconductor package may include a semiconductor device mounted on a package substrate, a conductive roof located over the semiconductor device, a plurality of conductive walls disposed on the package substrate and arrayed in a closed loop line surrounding the semiconductor device, conductive pillars disposed in regions between the conductive walls on the package substrate and bonded to the conductive roof, and a first dielectric layer filling a space between the package substrate and the conductive roof.

According to an embodiment, a method of fabricating a semiconductor package may include forming conductive walls on a package substrate to define a mount region surrounded by the conductive walls, forming conductive pillars in regions between the conductive walls, mounting a semiconductor device on the mount region, and providing a stack sheet over the conductive walls and the conductive pillars to cover the semiconductor device. The stack sheet may include a first dielectric layer and a conductive roof. The conductive pillars may be infiltrated into the first dielectric layer using a lamination process to combine top portions of the conductive pillars with the conductive roof.

According to an embodiment, a memory card may include a semiconductor package. The semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed on the package substrate and bonded to the conductive roof. The plurality of conductive pillars may be disposed in regions between the conductive walls to provide interconnecting tunnels corresponding to spaces between the conductive walls and the conductive pillars. A first dielectric layer may fill a space between the package substrate and the conductive roof.

According to an embodiment, a memory card may include a semiconductor package. The semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed in regions between the conductive walls on the package substrate and bonded to the conductive roof. A first portion of a sidewall of each conductive pillar may be combined with one of the conductive walls by a bridge portion, and a second portion of a sidewall of each conductive pillar is spaced apart from one of the conductive walls to provide an interconnecting tunnel corresponding to a space. A first dielectric layer may fill a space between the package substrate and the conductive roof.

According to an embodiment, a memory card may include a semiconductor package. The semiconductor package may include a semiconductor device mounted on a package substrate, a conductive roof located over the semiconductor device, a plurality of conductive walls disposed on the package substrate and arrayed in a closed loop line surrounding the semiconductor device, conductive pillars disposed in regions between the conductive walls on the package substrate and bonded to the conductive roof, and a first dielectric layer filling a space between the package substrate and the conductive roof.

According to an embodiment, an electronic system may include a semiconductor package. The semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed on the package substrate and bonded to the conductive roof. The plurality of conductive pillars may be disposed in regions between the conductive walls to provide interconnecting tunnels corresponding to spaces between the conductive walls and the conductive pillars. A first dielectric layer may fill a space between the package substrate and the conductive roof.

According to an embodiment, an electronic system may include a semiconductor package. The semiconductor package may include a semiconductor device mounted on a package substrate, a conductive roof located over the semiconductor device, and a plurality of conductive walls disposed on the package substrate and arrayed in a closed loop line surrounding the semiconductor device. Conductive pillars may be disposed in regions between the conductive walls on the package substrate and bonded to the conductive roof. A first portion of a sidewall of each conductive pillar may be combined with one of the conductive walls by a bridge portion, and a second portion of a sidewall of each conductive pillar may be spaced apart from one of the conductive walls to provide an interconnecting tunnel corresponding to a space. A first dielectric layer may fill a space between the package substrate and the conductive roof.

According to an embodiment, an electronic system may include a semiconductor package. The semiconductor package may include a semiconductor device mounted on a package substrate, a conductive roof located over the semiconductor device, a plurality of conductive walls disposed on the package substrate and arrayed in a closed loop line surrounding the semiconductor device, conductive pillars disposed in regions between the conductive walls on the package substrate and bonded to the conductive roof, and a first dielectric layer filling a space between the package substrate and the conductive roof.

According to an embodiment, an electromagnetic interference (EMI) shielding part may be included in a semiconductor package, mounted on a package substrate, and surrounding a semiconductor device. The EMI shielding part may include a boundary having a loop shape to define an inner region within the boundary and an outer region outside the boundary. The EMI may include a roof located over the boundary and inner region. The boundary may include regions allowing the inner region to connect with the outer region.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

A semiconductor package may include a semiconductor device. The semiconductor device may include a single semiconductor chip or a plurality of semiconductor chips which are stacked. The semiconductor chips may be obtained by separating a semiconductor substrate such as a wafer into a plurality of pieces using a die sawing process. The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chip may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

Figure 2:
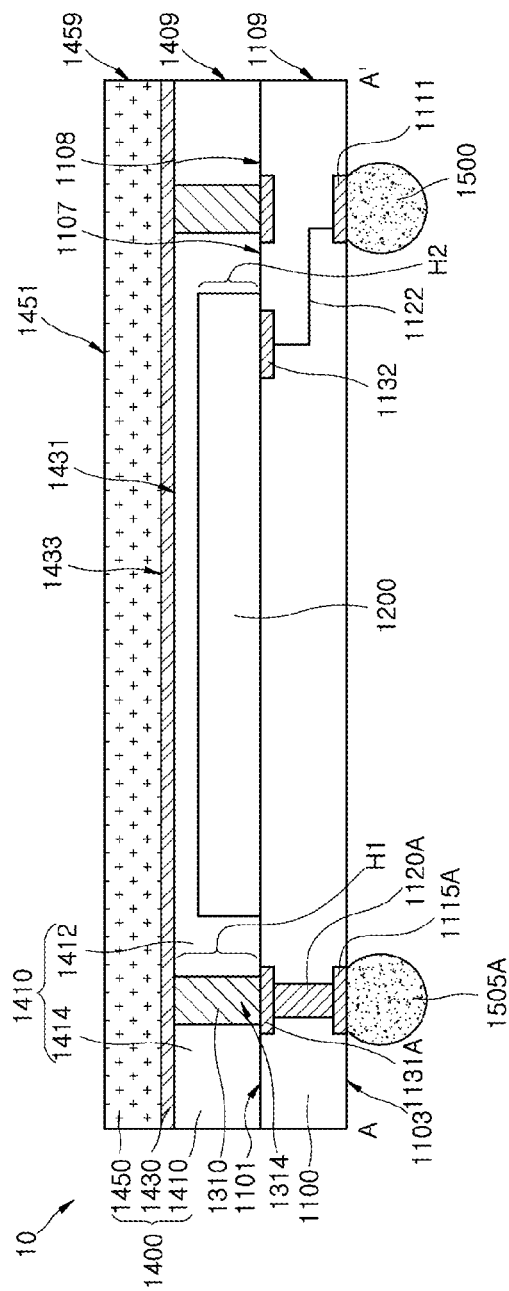
Figure 3:
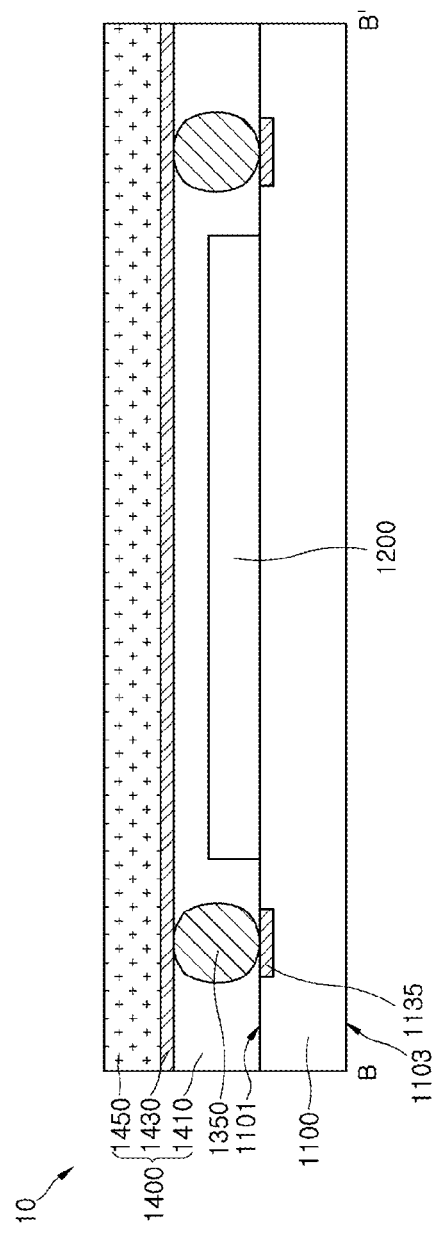
Figure 4:
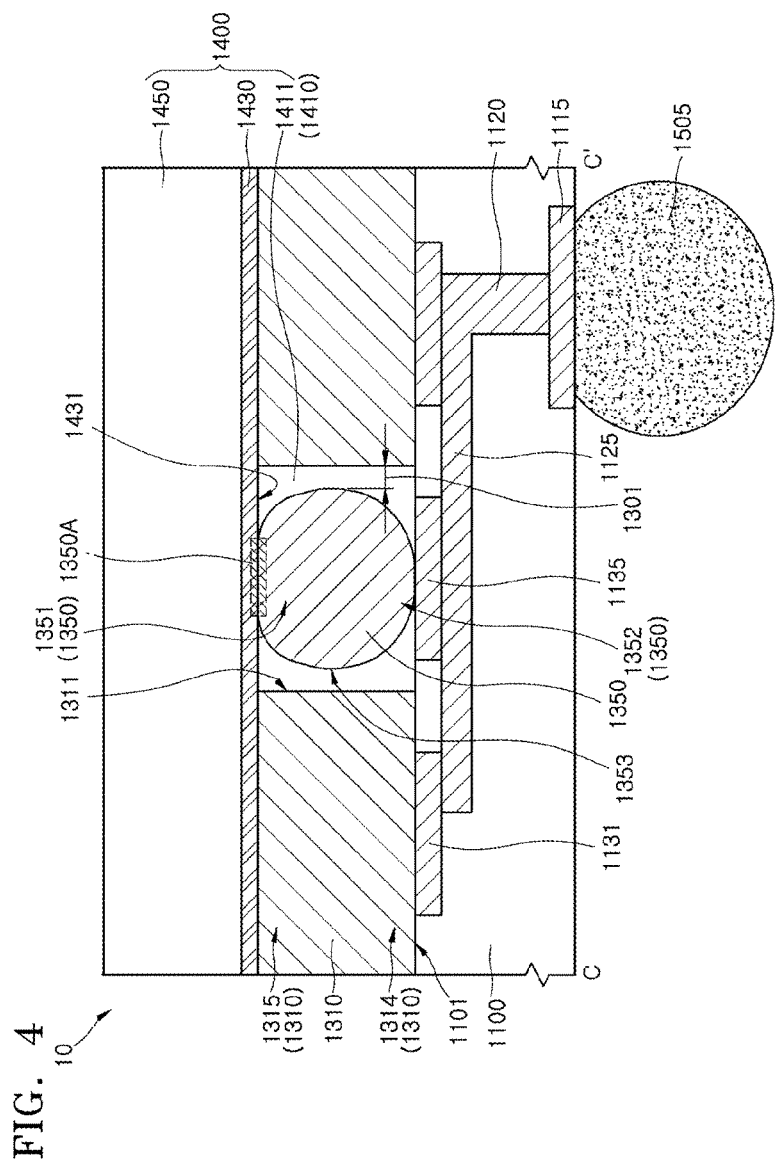
Figure 5:
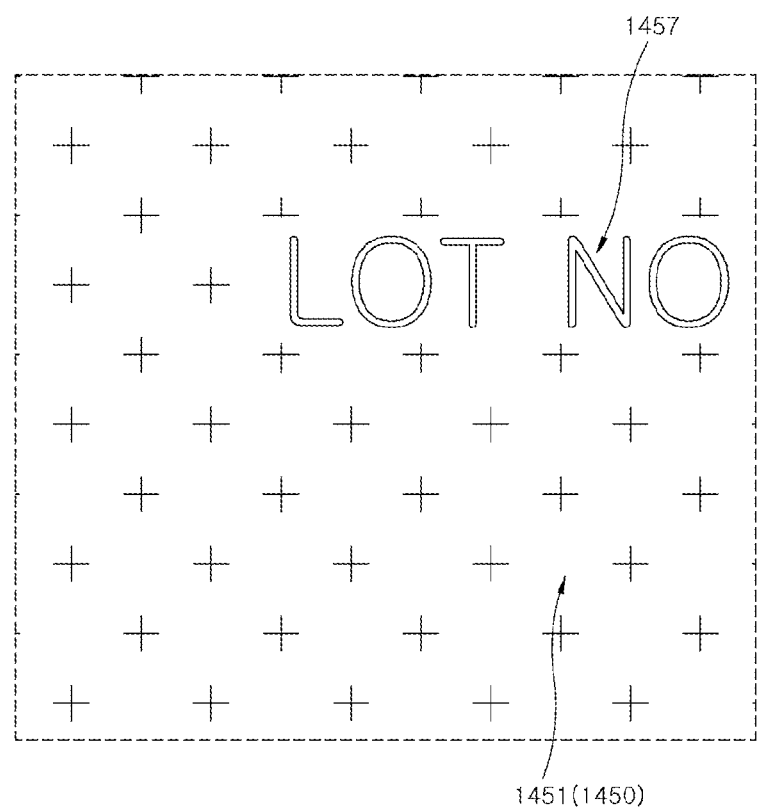
Figure 6:
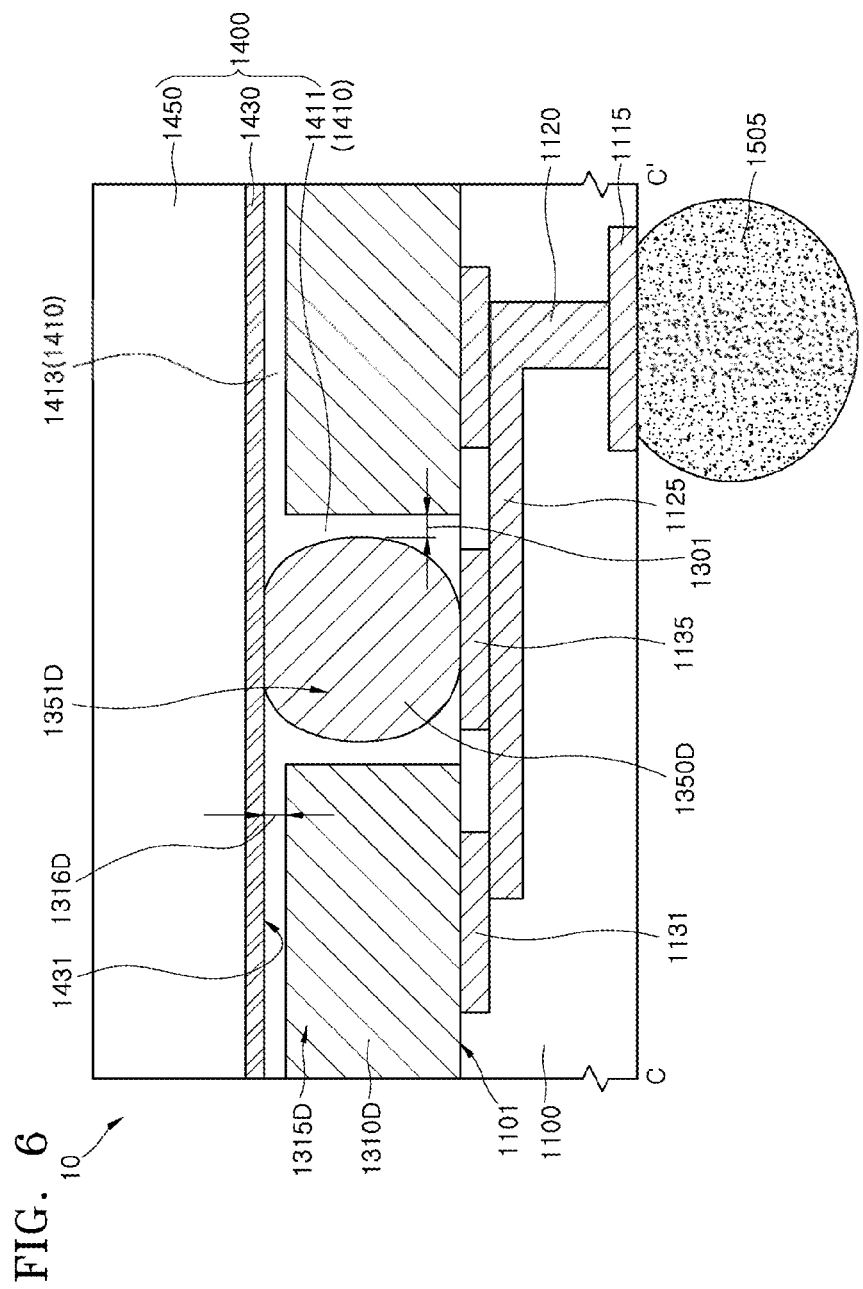

FIG. 1 is a plan view illustrating a representation of an example of a semiconductor package 10 according to an embodiment. FIGS. 2, 3 and 4 are cross-sectional views taken along lines A-A', B-B' and C-C' of FIG. 1, respectively. FIG. 5 illustrates a top surface of the semiconductor package 10, and FIG. 6 is a cross-sectional view illustrating a modified embodiment of the semiconductor package 10 illustrated in FIG. 4.

Referring to FIGS. 1 and 2, the semiconductor package 10 may include a package substrate 1100 and a semiconductor device 1200 mounted on the package substrate 1100. In addition, the semiconductor package 10 may be configured to include an EMI shielding part which is comprised of conductive walls 1310, conductive pillars 1350 and a conductive roof 1430. The conductive walls 1310, the conductive pillars 1350 and the conductive roof 1430 constituting the EMI shielding part may enclose the semiconductor device 1200 to shield the semiconductor device 1200 from EMI.

A first dielectric layer 1410 may be disposed to cover the semiconductor device 1200 mounted on the package substrate 1100 and to function as a protection layer protecting the semiconductor device 1200, as illustrated in FIG. 2. The first dielectric layer 1410 may include epoxy resin, silicone resin or a polymer. The first dielectric layer 1410 may electrically insulate or isolate the semiconductor device 1200 from the conductive roof 1430 located over the semiconductor device 1200. The conductive walls 1310 may be embedded in the first dielectric layer 1410. For example, sidewalls of the conductive walls 1310 may be surrounded by the first dielectric layer 1410. Thus, the first dielectric layer 1410 may prevent the conductive walls 1310 from being exposed to external environment of the semiconductor package 10.

A first portion 1412 of the first dielectric layer 1410 may be disposed in an inside region surrounded by the conductive walls 1310 to cover the semiconductor device 1200, and a second portion 1414 of the first dielectric layer 1410 may be disposed in an outside region of the conductive walls 1310 to cover edges of the package substrate 1100. Accordingly, each of sidewalls 1409 of the first dielectric layer 1410 may be exposed to correspond to a portion of any one among sidewalls of the semiconductor package 10. The sidewalls 1409 of the first dielectric layer 1410 may be vertically aligned with sidewalls 1109 of the package substrate 1100, respectively.

Since the conductive walls 1310 are isolated from the external environment of the semiconductor package 10 by the first dielectric layer 1410, the first dielectric layer 1410 may prevent the conductive walls 1310 from being oxidized or contaminated by the external environment of the semiconductor package 10. In addition, the first dielectric layer 1410 may prevent a material of the conductive walls 1310 from migrating into an outside region of the semiconductor package 10. Thus, even though the conductive walls 1310 are formed to include a metal material (e.g., a copper material) which is capable of being readily migrated or contaminated, the metal material of the conductive walls 1310 may not be migrated or contaminated because of the presence of the first dielectric layer 1410. If each of the conductive walls 1310 is comprised of metal such as copper, an EMI shielding effect of the conductive walls 1310 may be improved.

Referring to FIG. 2, a bottom surface 1431 of the conductive roof 1430 may be in contact with the first dielectric layer 1410, and a top surface 1433 of the conductive roof 1430 may be in contact with a second dielectric layer 1450. The first dielectric layer 1410, the conductive roof 1430 and the second dielectric layer 1450 may constitute a stack sheet 1400, and the stack sheet 1400 may be configured to protect the semiconductor device 1200. The second dielectric layer 1450 may include a different dielectric material from the first dielectric layer 1410. Sidewalls 1459 of the second dielectric layer 1450 may be vertically aligned with the sidewalls 1409 of the first dielectric layer 1410, respectively.

The second dielectric layer 1450 may contain a visible dye. For example, the second dielectric layer 1450 may include an epoxy molding compound (EMC) material containing a carbon black material acting as the visible dye. The epoxy component of the EMC material in the second dielectric layer 1450 may be cured to make the second dielectric layer 1450 a hard layer. The second dielectric layer 1450 may have a certain color, for example, a black color because of the presence of the visible dye. Accordingly, an identification mark (1457 of FIG. 5) engraved on a top surface 1451 of the second dielectric layer 1450 may be clearly readable. The identification mark 1457 may be engraved using a laser beam, and the conductive roof 1430 may act as a protector that prevents the first dielectric layer 1410 and the semiconductor device 1200 from being damaged while the identification mark 1457 is formed using a laser beam. When the identification mark 1457 is engraved in the second dielectric layer 1450 using a laser beam having an appropriate wavelength, the conductive roof 1430 may act as an etch stopper even though the second dielectric layer 1450 is over-etched to expose the top surface 1433 of the conductive roof 1430. That is, the conductive roof 1430 may prevent the first dielectric layer 1410 and the semiconductor device 1200 from being damaged by a laser beam used in formation of the identification mark 1457. Accordingly, even though interconnection structures (not illustrated) for electrically connecting the semiconductor 1200 to the package substrate 1100 are disposed in the first dielectric layer 1410, the conductive roof 1430 may prevent the interconnection structures from being damaged by a laser beam used in formation of the identification mark 1457.

In the stack sheet 1400, the first dielectric layer 1410 may be disposed to substantially cover the bottom surface 1431 of the conductive roof 1430 and the second dielectric layer 1450 may be disposed to substantially cover the top surface 1433 of the conductive roof 1430. Thus, the conductive roof 1430 may be sandwiched between the first and second dielectric layers 1410 and 1450 and may be isolated from an external environment of the semiconductor package 10. That is, the bottom surface 1431 and the top surface 1433 of the conductive roof 1430 may be substantially isolated from the external environment of the semiconductor package 10 by the first and second dielectric layers 1410 and 1450, respectively. Thus, the first and second dielectric layers 1410 and 1450 may prevent the conductive roof 1430 from being oxidized or contaminated by the external environment of the semiconductor package 10. Since the conductive roof 1430 is not substantially exposed to the external environment of the semiconductor package 10, the first and second dielectric layers 1410 and 1450 may prevent a material of the conductive roof 1430 from being migrated into an outside region of the semiconductor package 10. Accordingly, even though the conductive roof 1430 is formed to include a metal material (e.g., a copper material) which is capable of being readily migrated or contaminated, the metal material of the conductive roof 1430 may not be migrated or contaminated because of the presence of the first and second dielectric layers 1410 and 1450. That is, the conductive roof 1430 may include metal, for example, copper or copper alloy. In such a case, an EMI shielding effect of the conductive roof 1430 may be improved because the copper or the copper alloy has an excellent conductivity.

Referring again to FIG. 1, the semiconductor device 1200 may have a rectangular shape in a plan view. The conductive walls 1310 may be disposed and arrayed to surround the semiconductor device 1200. Each of the conductive walls 1310 may extend in one direction to have a bar shape and to have two opposite end sidewalls 1311. In some embodiments, each of the conductive walls 1310 may include a metal bar and a diffusion barrier layer coated on an entire surface of the metal bar. The conductive walls 1310 may be arrayed so that the end sidewalls 1311 of the conductive walls 1310 face each other. The conductive walls 1310 may be disposed to be spaced apart from each other, and the conductive pillars 1350 may be disposed in regions 1105 between the conductive walls 1310, respectively. The conductive walls 1310 may be arrayed in succession on the package substrate 1100 to provide a mount region 1102 on which the semiconductor device 1200 is located. The conductive walls 1310 may be arrayed to have a shape of a frame surrounding sidewalls of the semiconductor device 1200.

The conductive walls 1310 may be disposed on a first surface 1101 of the package substrate 1100 to have a certain height, as illustrated in FIG. 2. The semiconductor device 1200 may also be mounted on the first surface 1101 of the package substrate 1100 and may be surrounded by the conductive walls 1310. A height H1 of the conductive walls 1310 from the first surface 1101 of the package substrate 1100 may be greater than a height H2 of the semiconductor device 1200 from the first surface 1101 of the package substrate 1100. The height H1 of the conductive walls 1310 may be set to be different according to the height H2 of the semiconductor device 1200. A width of the conductive walls 1310 may be set to be different according to a design scheme of the semiconductor package 10 or the package substrate 1100. In some embodiments, the conductive walls 1310 may have a width of about several tens of micrometers. The conductive walls 1310 may be disposed so that each sidewall of the semiconductor device 1200 faces at least two of the conductive walls 1310. Four of the regions 1105 between the conductive walls 1310 may be disposed to be adjacent to four corners of the semiconductor device 1200, respectively. Thus, four of the conductive pillars 1350 may be disposed in the regions 1105 which are located at four corners of a rectangular closed loop that is comprised of the conductive walls 1310, respectively. In addition, the conductive pillars 1350 may be disposed so that each sidewall of the semiconductor device 1200 faces at least one of the conductive pillars 1350.

Referring to FIGS. 1, 3 and 4, the conductive pillars 1350 may be disposed in the regions 1105 between the conductive walls 1310, respectively. The conductive pillars 1350 may be disposed on the first surface 1101 of the package substrate 1100 so that sidewall 1353 of the conductive pillars 1350 are spaced apart from the end sidewalls 1311 of the conductive walls 1310. Spaces between the conductive pillars 1350 and the conductive walls 1310 may correspond to interconnecting tunnels 1301. The conductive walls 1310 and the conductive pillars 1350 may constitute a boundary having a rectangular closed loop shape that defines an inner region 1107 and an outer region 1108, and the interconnecting tunnels 1301 may act as paths that spatially connect the inner region 1107 to the outer region 1108. The first portion 1412 of the first dielectric layer 1410 located in the inner region 1107 and the second portion 1414 of the first dielectric layer 1410 located in the outer region 1108 may be connected to each other by extension portions (1411 of FIG. 4) of the first dielectric layer 1410 filling the interconnecting tunnels 1301. While the semiconductor package 10 is fabricated, a material of the first dielectric layer 1410 may flow from the inner region 1107 into the outer region 1108 or from the outer region 1108 into the inner region 1107 through the interconnecting tunnels 1301.

As illustrated in FIG. 4, a bottom portion 1352 of each conductive pillar 1350 may be combined with the package substrate 1100, and a top portion 1351 of each conductive pillar 1350 may be combined with or bonded to the bottom surface 1431 of the conductive roof 1430. Accordingly, the conductive pillars 1350 may electrically connect the package substrate 1100 to the conductive roof 1430. The conductive pillars 1350 may be combined with the package substrate 1100 and the conductive roof 1430 using a soldering process.

The conductive roof 1430 may be grounded through the conductive pillars 1350 and the package substrate 1100. For a reliable and successful ground of the conductive roof 1430, the conductive roof 1430 may be combined with the conductive pillars 1350 using a solder material rather than mere mechanical contact. That is, if the conductive roof 1430 is combined with the conductive pillars 1350 using a solder material, an intermetallic compound may be generated at an interface between the conductive roof 1430 and the conductive pillars 1350 to provide a reliable contact between the conductive roof 1430 and the conductive pillars 1350. In some embodiments, each of the conductive pillars 1350 may include a solder material. In such a case, a soldering interface 1350A may be provided between the top portion 1351 of each conductive pillar 1350 and the bottom surface 1431 of the conductive roof 1430. That is, the conductive roof 1430 may be combined with the conductive pillars 1350 by a solder material.

In order that the soldering interface 1350A is provided between the top portion 1351 of each conductive pillar 1350 and the bottom surface 1431 of the conductive roof 1430, the top portion 1351 of each conductive pillar 1350 may include a solder material or each of the conductive pillars 1350 may include a solder material. For example, each of the conductive pillars 1350 may correspond to a solder ball. FIGS. 3 and 4 illustrate an example in which each of the conductive pillars 1350 is comprised of a single solder ball. In some other embodiments, each of the conductive pillars 1350 may include a plurality of solder balls which are vertically stacked to have a pillar shape.

Referring to FIGS. 3 and 4, a top portion 1315 of each conductive wall 1310 may merely be in mechanical contact with the bottom surface 1431 of the conductive roof 1430. In such a case, a contact resistance value between the top portion 1315 of each conductive wall 1310 and the bottom surface 1431 of the conductive roof 1430 may be relatively higher as compared with a case that the top portion 1315 of each conductive wall 1310 is combined with the bottom surface 1431 of the conductive roof 1430 using a solder material. Since the conductive roof 1430 is grounded through the conductive pillars 1350 and the package substrate 1100, the semiconductor package 10 may still exhibit an excellent EMI shielding effect even though a contact resistance value between each conductive wall 1310 and the conductive roof 1430 is relatively high.

In the event that the conductive roof 1430 is connected to the conductive walls 1310 only by a mechanical surface-to-surface contact without using a soldering combination, the conductive roof 1430 or each of the conductive walls 1310 may include a metal material, for example, a copper material or a copper alloy material having a conductivity which is higher than a solder material. Accordingly, an EMI shielding effect of the conductive roof 1430 or the conductive walls 1310 may be improved. Because the conductive walls 1310 as well as the conductive pillars 1350 are configured to contact the conductive roof 1430, top surfaces of the conductive walls 1310 may be substantially coplanar with top surfaces of the conductive pillars 1350.

Referring to FIG. 6, conductive walls 1310D may be disposed not to contact the conductive roof 1430. If a top portion 1351D of a conductive pillar 1350D has a height which is greater than a height of top portions 1315D of the conductive walls 1310D so that top surfaces of the conductive walls 1310D are located at a level which is lower than a top surface of the conductive pillar 1350D, gaps 1316D may be provided between the conductive roof 1430 and the conductive walls 1310D. Portions 1413 of the first dielectric layer 1410 may extend into the gaps 1316D. Thus, the conductive roof 1430 may be grounded through not the conductive walls 1310D but the conductive pillar 1350D, because of the presence of the gaps 1316D. That is, the conductive roof 1430 may still be grounded through the conductive pillar 1350D because the conductive pillar 1350D is disposed to electrically connect the conductive roof 1430 to the package substrate 1100. FIG. 6 illustrates modified examples of the conductive wall 1310 and the conductive pillar 1350 illustrated in FIG. 4. Thus, in FIG. 6, the same reference numerals as used in FIG. 4 denote the same elements.

Referring again to FIG. 4, the bottom portion 1352 of the conductive pillar 1350 may be combined with and connected to circuit traces that are disposed to be adjacent to the first surface 1101 of the package substrate 1100. The circuit traces may be comprised of interconnection structures and may be disposed in an upper portion of the package substrate 1100. Each of the circuit traces may include a conductive material such as a copper material. The conductive pillar 1350 may be disposed on and connected to a first landing pad 1135 that is disposed on the first surface 1101 of the package substrate 1100 and is any one of the circuit traces. The first landing pad 1135 may be a conductive pad on which the conductive pillar 1350 is disposed. The bottom portion 1352 of the conductive pillar 1350 having a solder ball shape may be combined with the first landing pad 1135 using a solder material. A first ground pattern 1115 corresponding to any one of the circuit traces may be disposed on a second surface 1103 of the package substrate 1100 opposite to the conductive pillar 1350. The first ground pattern 1115 may have a pad shape, and a first ground connector 1505 such as a solder ball for electrically connecting the first ground pattern 1115 to an external device may be disposed on the first ground pattern 1115. The first ground pattern 1115 may be electrically connected to the first landing pad 1135 through first internal connectors 1120 and 1125, and the first internal connectors 1120 and 1125 may be disposed in the package substrate 1100. The first internal connectors 1120 and 1125 may include a first internal extension 1125 extending in a horizontal direction and a first internal via 1120 substantially penetrating the package substrate 1100 in a vertical direction to have a through via shape.

A second landing pad 1131 may be disposed on the first surface 1101 of the package substrate 1100 and may be adjacent to the first landing pad 1135. The second landing pad 1131 may be a pad which is combined with a bottom portion 1314 of the conductive wall 1310. The second landing pad 1131 may be spaced apart from the first landing pad 1135, and the first internal extension 1125 may extend to electrically connect the second landing pad 1131 to the first landing pad 1135. Even though the conductive wall 1310 is not directly connected to the conductive pillar 1350, the conductive wall 1310 may be electrically connected to the conductive pillar 1350 because the second landing pad 1131 is electrically connected to the first landing pad 1135 through the first internal extension 1125. The conductive wall 1310 may be electrically connected to the first ground connector 1505 through a path including the second landing pad 1131, the first internal extension 1125, the first internal via 1120 and the first ground pattern 1115. Thus, an EMI shielding structure including the conductive wall 1310, the conductive pillar 1350 and the conductive roof 1430 may be grounded through the first ground connector 1505.

Referring again to FIG. 2, the bottom portions 1314 of the conductive walls 1310 may be combined with and connected to the circuit traces which are disposed on the first surface 1101 of the package substrate 1100 and in a body of the package substrate 1100. One of the conductive walls 1310 may be disposed on and connected to a third landing pad 1131A that is located on the first surface 1101 of the package substrate 1100 to act as one of the circuit traces. The third landing pad 1131A may be a conductive pad on which the conductive wall 1310 is disposed. The conductive wall 1310 may be formed on the third landing pad 1131A by an electroplating process. Thus, the conductive wall 1310 may be combined with the third landing pad 1131A.

A second ground pattern 1115A corresponding to one of the circuit traces may be disposed on the second surface 1103 of the package substrate 1100 opposite to the semiconductor device 1200. The second ground pattern 1115A may have a pad shape, and a second ground connector 1505A such as a solder ball for electrically connecting the second ground pattern 1115A to an external device may be disposed on the second ground pattern 1115A. A second internal connector 1120A may be disposed in the package substrate 1100 to connect the second ground pattern 1115A to the third landing pad 1131A. The second internal connector 1120A may substantially penetrate the package substrate 1100 to have a through via shape.

Referring again to FIGS. 1 and 2, the semiconductor device 1200 mounted on the first surface 1101 of the package substrate 1100 may be electrically connected to the package substrate 1100 through bonding wires (not illustrated) or bumps (not illustrated). Conductive pads 1132 may be disposed on the first surface 1101 of the package substrate 1100 and may be electrically connected to the semiconductor device 1200 through bumps (not illustrated). External connectors 1111 having pad shapes may be disposed on the second surface 1103 of the package substrate 1100 and may be electrically connected to the conductive pads 1132. Third internal connectors 1122 may be disposed in the package substrate 1100 to electrically connect the external connectors 1111 to the conductive pads 1132. Connectors 1500, for example, solder balls may be attached to the external connectors 1111 to electrically connect the external connectors 1111 to an external device.

The semiconductor device 1200 may include a semiconductor chip or a semiconductor die. Although not illustrated in the drawings, the semiconductor device 1200 may include a plurality of semiconductor chips or a plurality of semiconductor dies which are stacked. The plurality of stacked semiconductor chips or the plurality of stacked semiconductor dies may be electrically connected to the package substrate 1100 using bonding wires or bumps (not illustrated). The plurality of stacked semiconductor chips or the plurality of stacked semiconductor dies may be electrically connected to each other by through electrodes, for example, through silicon vias (TSVs) (not illustrated). The package substrate 1100 may be a printed circuit board (PCB). In some embodiments, the package substrate 1100 may be a flexible substrate that can warp or bend.

Figure 7:
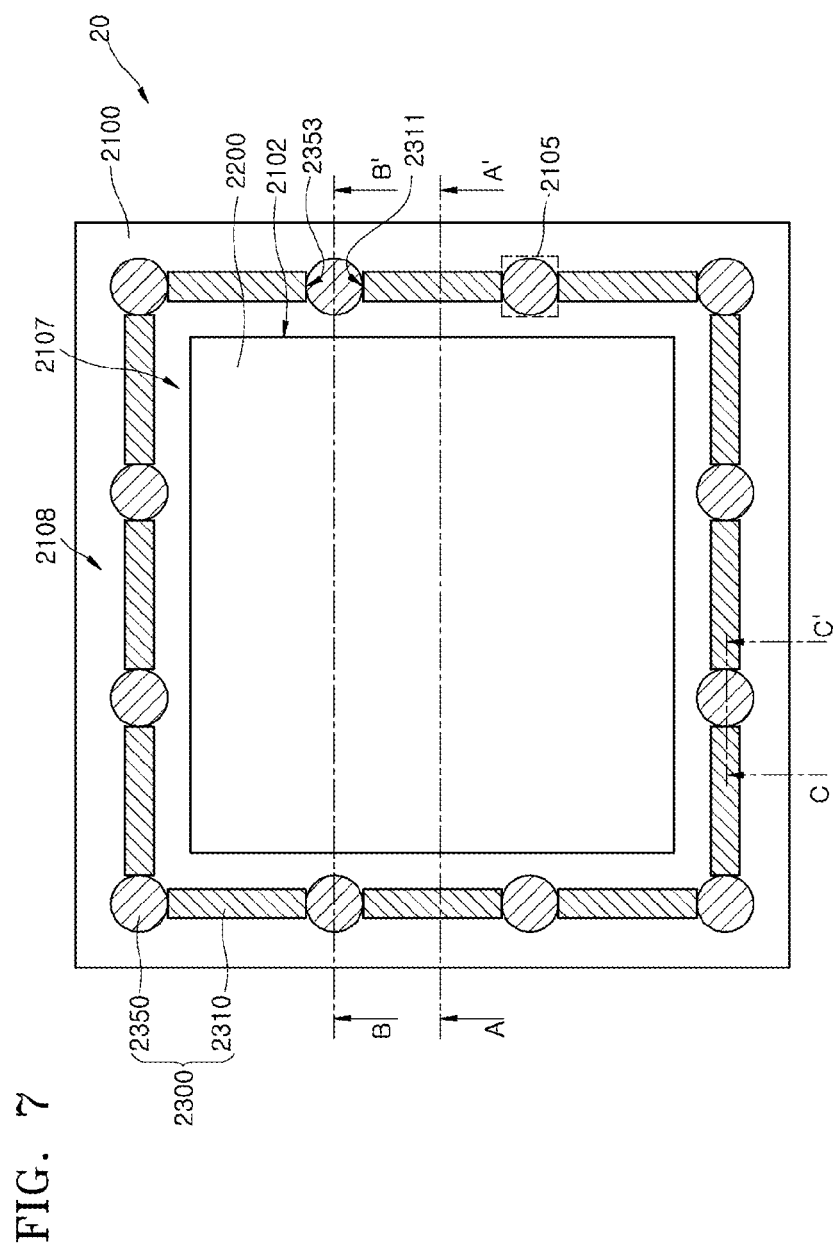
FIGS. 7 to 11 illustrate a representation of an example of a semiconductor package according to an embodiment.
Figure 8:
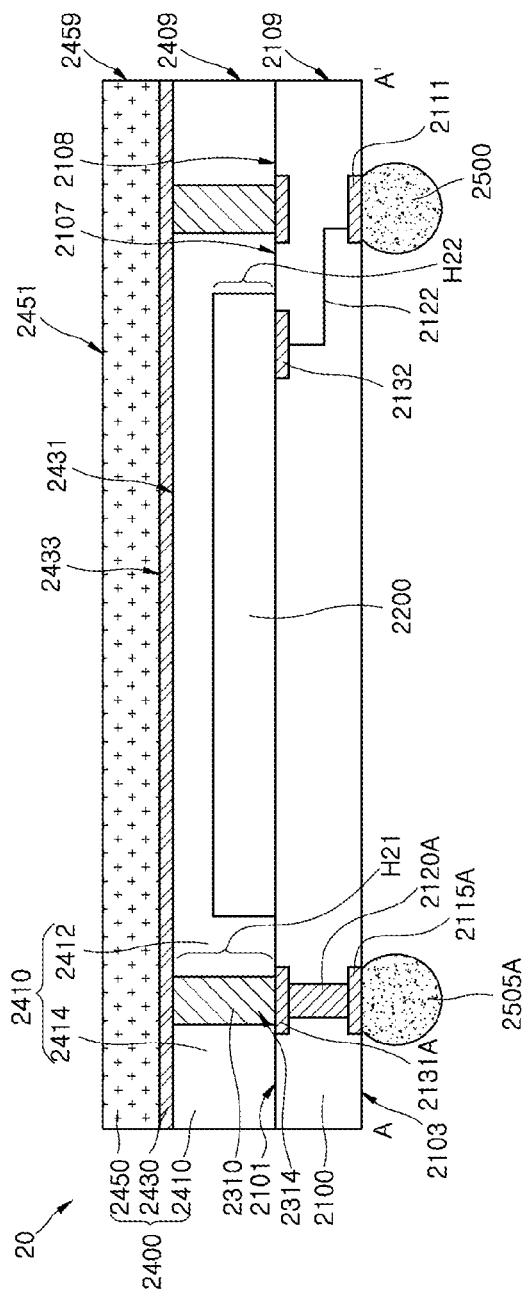
Figure 9:
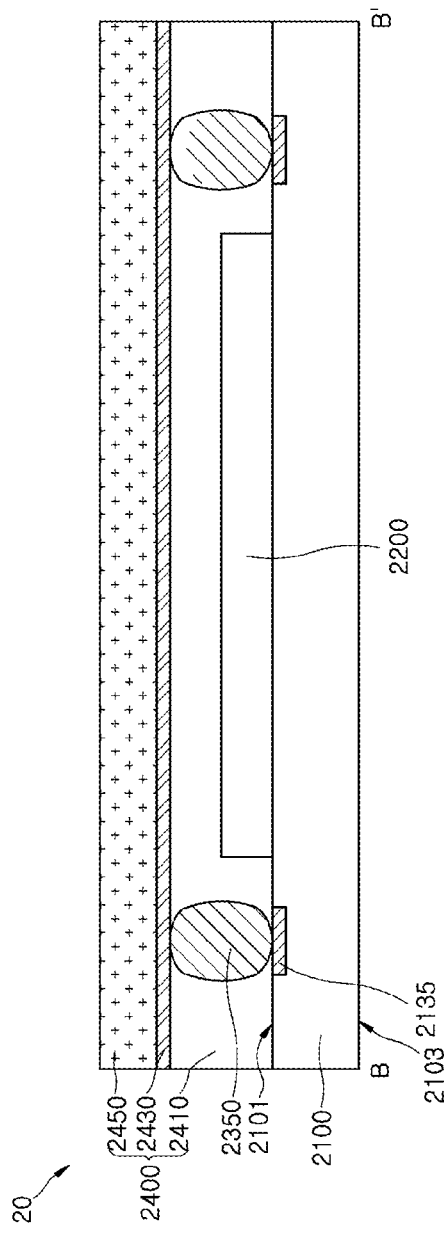
Figure 10:
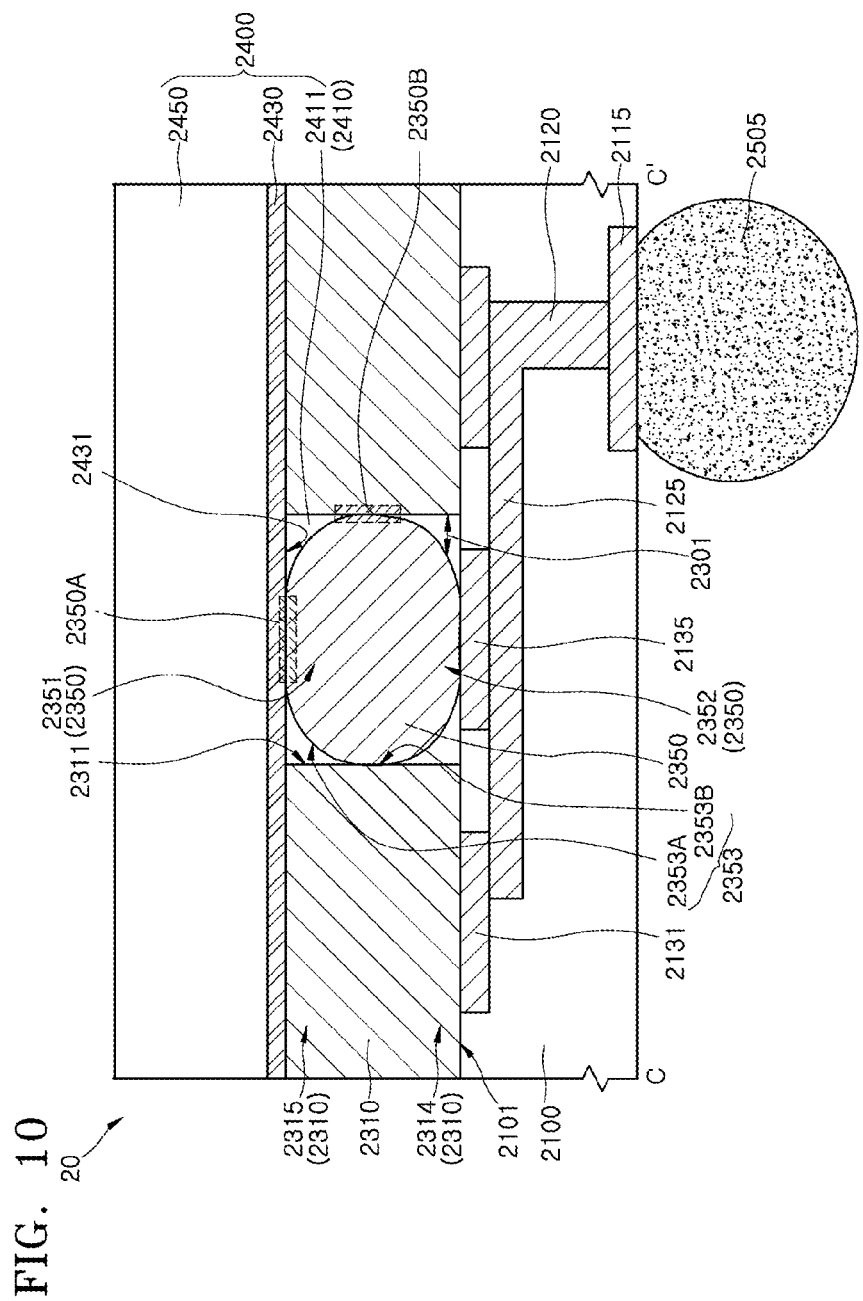
Figure 11:
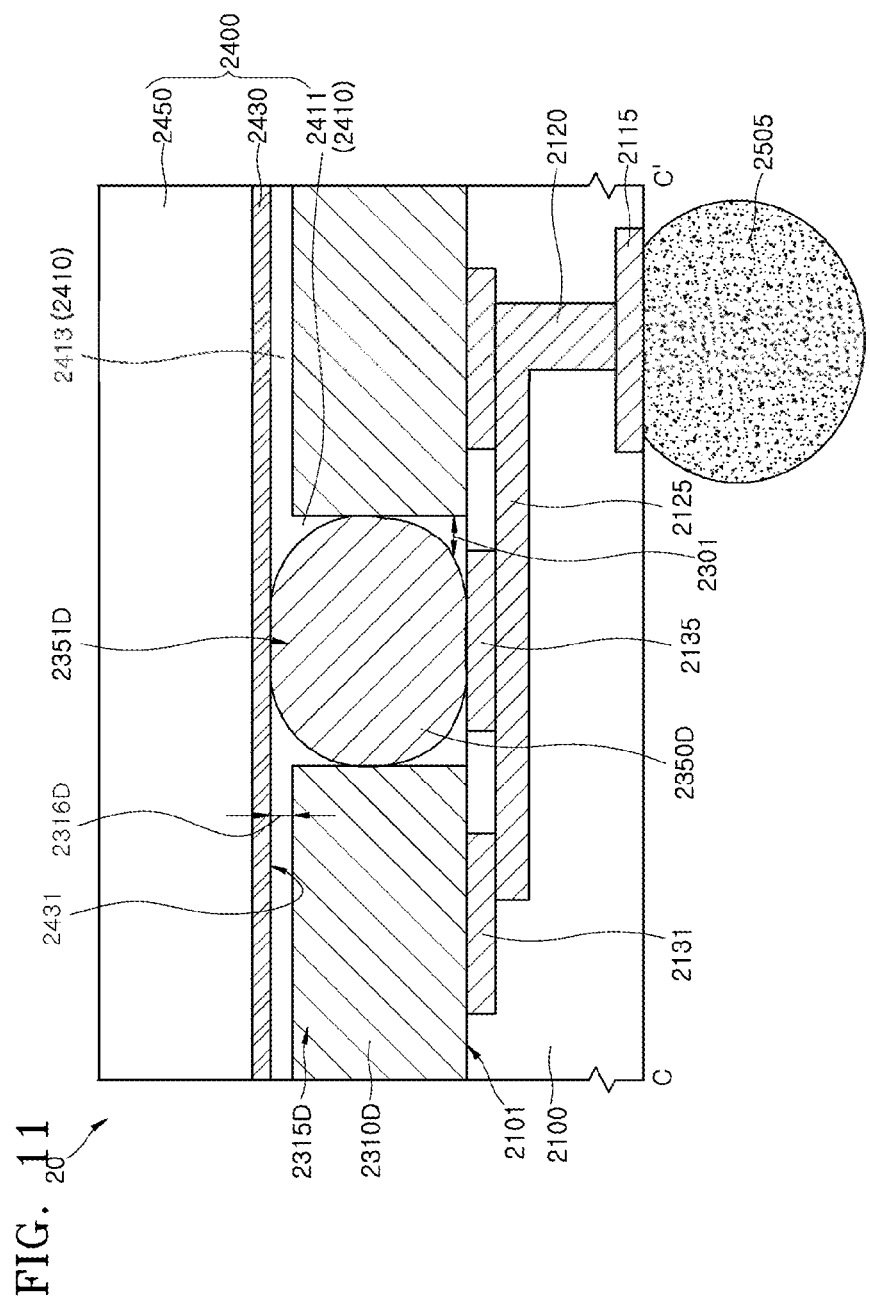

FIG. 7 is a plan view illustrating a representation of an example of a semiconductor package 20 according to an embodiment. FIGS. 8, 9 and 10 are cross-sectional views taken along lines A-A', B-B' and C-C' of FIG. 7, respectively. FIG. 11 is a cross-sectional view illustrating a representation of an example of a modified embodiment of the semiconductor package 20 illustrated in FIG. 10.

Referring to FIGS. 7 and 8, the semiconductor package 20 may include a package substrate 2100 and a semiconductor device 2200 mounted on the package substrate 2100. In addition, the semiconductor package 20 may be configured to include an EMI shielding part which is comprised of conductive walls 2310, conductive pillars 2350 and a conductive roof 2430. The conductive walls 2310, the conductive pillars 2350 and the conductive roof 2430 constituting the EMI shielding part may enclose the semiconductor device 2200 to shield the semiconductor device 2200 from EMI.

A first dielectric layer 2410 may be disposed to cover the semiconductor device 2200 mounted on the package substrate 2100 and to function as a protection layer protecting the semiconductor device 2200, as illustrated in FIG. 8. The first dielectric layer 2410 may electrically insulate or isolate the semiconductor device 2200 from the conductive roof 2430 located over the semiconductor device 2200. The conductive walls 2310 may be embedded in the first dielectric layer 2410. For example, sidewalls of the conductive walls 2310 may be surrounded by the first dielectric layer 2410. Thus, the first dielectric layer 2410 may prevent the conductive walls 2310 from being exposed to external environment of the semiconductor package 20.

A first portion 2412 of the first dielectric layer 2410 may be disposed in an inside region surrounded by the conductive walls 2310 to cover the semiconductor device 2200, and a second portion 2414 of the first dielectric layer 2410 may be disposed in an outside region of the conductive walls 2310 to cover edges of the package substrate 2100. Accordingly, each of sidewalls 2409 of the first dielectric layer 2410 may be exposed to correspond to a portion of any one among sidewalls of the semiconductor package 20. The sidewalls 2409 of the first dielectric layer 2410 may be vertically aligned with sidewalls 2109 of the package substrate 2100, respectively.

Since the conductive walls 2310 are isolated from the external environment of the semiconductor package 20 by the first dielectric layer 2410, the first dielectric layer 2410 may prevent the conductive walls 2310 from being oxidized or contaminated by the external environment of the semiconductor package 20. In addition, the conductive walls 2310 are not exposed to an outside region of the semiconductor package 20 due to the presence of the first dielectric layer 2410. Accordingly, the first dielectric layer 2410 may prevent a material of the conductive walls 2310 from migrating into the outside region of the semiconductor package 20.

Referring to FIG. 8, a bottom surface 2431 of the conductive roof 2430 may be in contact with the first dielectric layer 2410, and a top surface 2433 of the conductive roof 2430 may be in contact with a second dielectric layer 2450. Sidewalls 2459 of the second dielectric layer 2450 may be vertically aligned with the sidewalls 2409 of the first dielectric layer 2410, respectively. The first dielectric layer 2410, the conductive roof 2430 and the second dielectric layer 2450 may constitute a stack sheet 2400, and the stack sheet 2400 may be configured to protect the semiconductor device 2200. The second dielectric layer 2450 may contain a visible dye. For example, the second dielectric layer 2450 may include an EMC material containing a carbon black material acting as the visible dye. The conductive roof 2430 may block a laser beam that is irradiated onto the second dielectric layer 2450 to engrave an identification mark on the second dielectric layer 2450. Thus, the conductive roof 2430 may act as a protector that prevents the first dielectric layer 2410 and the semiconductor device 2200 from being damaged by a laser beam used in formation of the identification mark. In the stack sheet 2400, the first dielectric layer 2410 may be disposed to substantially cover the bottom surface 2431 of the conductive roof 2430 and the second dielectric layer 2450 may be disposed to substantially cover the top surface 2433 of the conductive roof 2430. Thus, the conductive roof 2430 may be sandwiched between the first and second dielectric layers 2410 and 2450 and may be isolated from the external environment of the semiconductor package 20. That is, the bottom surface 2431 and the top surface 2433 of the conductive roof 2430 may be substantially isolated from the external environment of the semiconductor package 20 by the first and second dielectric layers 2410 and 2450, respectively. Thus, the first and second dielectric layers 2410 and 2450 may prevent the conductive roof 2430 from being oxidized or contaminated by the external environment of the semiconductor package 20. Since the conductive roof 2430 is not substantially exposed to the outside region of the semiconductor package 20, the first and second dielectric layers 2410 and 2450 may prevent a material of the conductive roof 2430 from being migrated into the outside region of the semiconductor package 20. The conductive roof 2430 may include metal, for example, copper or copper alloy having an excellent conductivity.

Referring again to FIG. 7, the semiconductor device 2200 may have a rectangular shape in a plan view. The conductive walls 2310 may be disposed and arrayed to surround the semiconductor device 2200. Each of the conductive walls 2310 may extend in one direction to have a bar shape and to have two opposite end sidewalls 2311. The conductive walls 2310 may be arrayed so that the end sidewalls 2311 of the conductive walls 2310 face each other. The conductive walls 2310 may be disposed to be spaced apart from each other, and the conductive pillars 2350 may be disposed in regions 2105 between the conductive walls 2310, respectively.

The conductive walls 2310 may be disposed on a first surface 2101 of the package substrate 2100 to have a certain height, as illustrated in FIG. 8. The semiconductor device 2200 may also be mounted on the first surface 2101 of the package substrate 2100 and may be surrounded by the conductive walls 2310. A height H21 of the conductive walls 2310 from the first surface 2101 of the package substrate 2100 may be greater than a height H22 of the semiconductor device 2200 from the first surface 2101 of the package substrate 2100.

Referring to FIGS. 7 and 10, the conductive pillars 2350 may be disposed in the regions 2105 between the conductive walls 2310, respectively. Referring to FIG. 10, the conductive pillar 2350 may be disposed between the pair of adjacent conductive walls 2310 so that two opposite sidewalls 2353 of the conductive pillar 2350 face the end sidewalls 2311 of the pair of adjacent conductive walls 2310. Each of the sidewalls 2353 of the conductive pillar 2350 may include a first sidewall portion 2353A being spaced apart from the end sidewall 2311 of the conductive wall 2310 adjacent thereto and a second sidewall portion 2353B being in contact with and substantially combined with the end sidewall 2311 of the conductive wall 2310 adjacent thereto. The conductive pillars 2350 may be disposed on the first surface 2101 of the package substrate 2100 to have a certain height.

Referring to FIG. 10, a space between the end sidewall 2311 of the conductive wall 2310 and the first sidewall portion 2353A of the conductive pillar 2350 adjacent thereto may correspond to an interconnecting tunnel 2301. The end sidewall 2311 of the conductive wall 2310 and the second sidewall portion 2353B of the conductive pillar 2350 may contact each other to provide a soldering interface corresponding to a bridge portion 2350B. An entire portion or sidewall portions of the conductive pillar 2350 may include a solder material. In some embodiments, the conductive pillar 2350 may be a solder ball. The bridge portion 2350B may be formed by combining the conductive wall 2310 with the conductive pillar 2350 using a soldering process. In such a case, the conductive wall 2310 and the conductive pillar 2350 may be chemically and physically coupled to each other to provide reliable contact therebetween. The bridge portion 2350B may correspond to a soldering portion of the conductive wall 2310 and the conductive pillar 2350. The bridge portion 2350B may be located at a mid-level of the sidewall 2353 of the conductive pillar 2350. In some embodiments, four interconnecting tunnels 2301 may be provided in four spaces between the conductive pillar 2350 and the pair of adjacent conductive walls 2310, respectively. Two of the interconnecting tunnels 2301 may be located on and under the bridge portion 2350B, respectively.

The conductive walls 2310 and the conductive pillars 2350 may constitute a boundary having a rectangular closed loop shape that defines an inner region (2107 of FIG. 7) and an outer region (2108 of FIG. 7), and the interconnecting tunnels 2301 may act as paths that spatially connect the inner region 2107 to the outer region 2108. The first portion 2412 of the first dielectric layer 2410 located in the inner region 2107 and the second portion 2414 of the first dielectric layer 2410 located in the outer region 2108 may be connected to each other by extension portions (2411 of FIG. 10) of the first dielectric layer 2410 filling the interconnecting tunnels 2301. While the semiconductor package 20 is fabricated, a material of the first dielectric layer 2410 may flow from the inner region 2107 into the outer region 2108 or from the outer region 2108 into the inner region 2107 through the interconnecting tunnels 2301.

Referring to FIG. 10, a bottom portion 2352 of each conductive pillar 2350 may be combined with the package substrate 2100, and a top portion 2351 of each conductive pillar 2350 may be combined with the bottom surface 2431 of the conductive roof 2430. Accordingly, the conductive pillar 2350 may electrically connect the package substrate 2100 to the conductive roof 2430. The conductive pillar 2350 may be combined with the package substrate 2100 and the conductive roof 2430 using a soldering process.

The conductive pillar 2350 may act as one of main paths that electrically connect and ground the conductive roof 2430 to the package substrate 2100. In addition, the conductive pillar 2350 may be one of main paths that electrically connect and ground the conductive walls 2310 combined with the conductive pillar 2350 by the bridge portion 2350B to the package substrate 2100. For a reliable and successful ground of the conductive roof 2430, the conductive roof 2430 may be combined with the conductive pillars 2350 using a solder material rather than mere mechanical contact. In such a case, a soldering interface 2350A may be provided between the top portion 2351 of the conductive pillar 2350 and the bottom surface 2431 of the conductive roof 2430. That is, the conductive roof 2430 may be combined with the conductive pillars 2350 by the soldering interface 2350A.

In order that the soldering interface 2350A is provided between the top portion 2351 of the conductive pillar 2350 and the bottom surface 2431 of the conductive roof 2430, the top portion 2351 of the conductive pillar 2350 may include a solder material or an entire portion of the conductive pillar 2350 may include a solder material. For example, the conductive pillar 2350 may correspond to a solder ball. FIGS. 9 and 10 illustrate an example in which each of the conductive pillars 2350 is comprised of a single solder ball. However, the present disclosure is not limited thereto. In some other embodiments, each of the conductive pillars 2350 may include a plurality of solder balls which are vertically stacked to have a pillar shape.

Referring to FIGS. 9 and 10, a top portion 2315 of each conductive wall 2310 may merely be in mechanical contact with the bottom surface 2431 of the conductive roof 2430. In such a case, a contact resistance value between the top portion 2315 of each conductive wall 2310 and the bottom surface 2431 of the conductive roof 2430 may be relatively higher as compared with a case that the top portion 2315 of each conductive wall 2310 is combined with the bottom surface 2431 of the conductive roof 2430 using a solder material. Since the conductive roof 2430 is grounded through the conductive pillars 2350 and the package substrate 2100, the semiconductor package 20 may still exhibit an excellent EMI shielding effect even though a contact resistance value between each conductive wall 2310 and the conductive roof 2430 is relatively high.

In the event that the conductive roof 2430 is connected to the conductive walls 2310 only by a mechanical surface-to-surface contact without using a soldering combination, the conductive roof 2430 or each of the conductive walls 2310 may include a metal material, for example, a copper material or a copper alloy material having a conductivity which is higher than a solder material. Accordingly, an EMI shielding effect of the conductive roof 2430 or the conductive walls 2310 may be improved. Because the conductive walls 2310 as well as the conductive pillars 2350 are configured to contact the conductive roof 2430, top surfaces of the conductive walls 2310 may be substantially coplanar with top surfaces of the conductive pillars 2350.

Referring to FIG. 11, a conductive wall 2310D may be disposed not to contact the conductive roof 2430. If a top portion 2351D of a conductive pillar 2350D has a height which is greater than a height of top portions 2315D of the conductive walls 2310D so that top surfaces of the conductive walls 2310D are located at a level which is lower than top surfaces of the conductive pillars 2350D, gaps 2316D may be provided between the conductive roof 2430 and the conductive walls 2310D. Portions 2413 of the first dielectric layer 2410 may extend into the gaps 2316D. FIG. 11 illustrates modified examples of the conductive wall 2310 and the conductive pillar 2350 illustrated in FIG. 10. Thus, in FIG. 11, the same reference numerals as used in FIG. 4 denote the same elements.

Referring again to FIG. 10, the bottom portion 2352 of the conductive pillar 2350 may be connected to a first landing pad 2135 that is disposed on the first surface 2101 of the package substrate 2100 and is any one of circuit traces. The first landing pad 2135 may be a conductive pad on which the conductive pillar 2350 is disposed. A first ground pattern 2115 corresponding to any one of the circuit traces may be disposed on a second surface 2103 of the package substrate 2100 opposite to the conductive pillar 2350. The first ground pattern 2115 may have a pad shape, and a first ground connector 2505 such as a solder ball for electrically connecting the first ground pattern 2115 to an external device may be disposed on the first ground pattern 2115. The first ground pattern 2115 may be electrically connected to the first landing pad 2135 through first internal connectors 2120 and 2125, and the first internal connectors 2120 and 2125 may be disposed in the package substrate 2100. The first internal connectors 2120 and 2125 may include a first internal extension 2125 extending in a horizontal direction and a first internal via 2120 substantially penetrating the package substrate 2100 in a vertical direction to have a through via shape.

A second landing pad 2131 may be disposed on the first surface 2101 of the package substrate 2100 and may be adjacent to the first landing pad 2135. The second landing pad 2131 may be a pad which is combined with a bottom portion 2314 of the conductive wall 2310. The second landing pad 2131 may be spaced apart from the first landing pad 2135, and the first internal extension 2125 may extend to electrically connect the second landing pad 2131 to the first landing pad 2135. Accordingly, since the second landing pad 2131 is electrically connected to the first landing pad 2135 through the first internal extension 2125, the conductive wall 2310 may also be electrically connected to the conductive pillar 2350 through the first internal extension 2125. Thus, the conductive wall 2310 may be electrically connected to the first ground connector 2505 through a path including the second landing pad 2131, the first internal extension 2125, the first internal via 2120 and the first ground pattern 2115. In addition, the conductive wall 2310 may also be grounded through the bridge portion 2350B and conductive pillar 2350.

Referring again to FIG. 8, the bottom portions 2314 of the conductive walls 2310 may be connected to a third landing pad 2131A that is located on the first surface 2101 of the package substrate 2100 to act as one of circuit traces. The third landing pad 2131A may be a conductive pad on which the conductive wall 2310 is disposed. The conductive wall 2310 may be formed on the third landing pad 2131A by an electroplating process. Thus, the conductive wall 2310 may be combined with the third landing pad 2131A.

A second ground pattern 2115A corresponding to one of the circuit traces may be disposed on the second surface 2103 of the package substrate 2100 opposite to the semiconductor device 2200. The second ground pattern 2115A may have a pad shape, and a second ground connector 2505A such as a solder ball for electrically connecting the second ground pattern 2115A to an external device may be disposed on the second ground pattern 2115A. A second internal connector 2120A may be disposed in the package substrate 2100 to connect the second ground pattern 2115A to the third landing pad 2131A. The second internal connector 2120A may substantially penetrate the package substrate 2100 to have a through via shape.

Referring again to FIGS. 7 and 8, the semiconductor device 2200 mounted on the first surface 2101 of the package substrate 2100 may be electrically connected to conductive pads 2132 on the package substrate 2100 through bumps (not illustrated). The conductive pads 2132 may be disposed on the first surface 2101 of the package substrate 2100. External connectors 2111 having pad shapes may be disposed on the second surface 2103 of the package substrate 2100 and may be electrically connected to the conductive pads 2132. Third internal connectors 2122 may be disposed in the package substrate 2100 to electrically connect the external connectors 2111 to the conductive pads 2132. Connectors 2500, for example, solder balls may be attached to the external connectors 2111 to electrically connect the external connectors 2111 to an external device.

FIGS. 12 to 23 illustrate a representation of an example of a method of fabricating a semiconductor package according to an embodiment.

Figure 12:
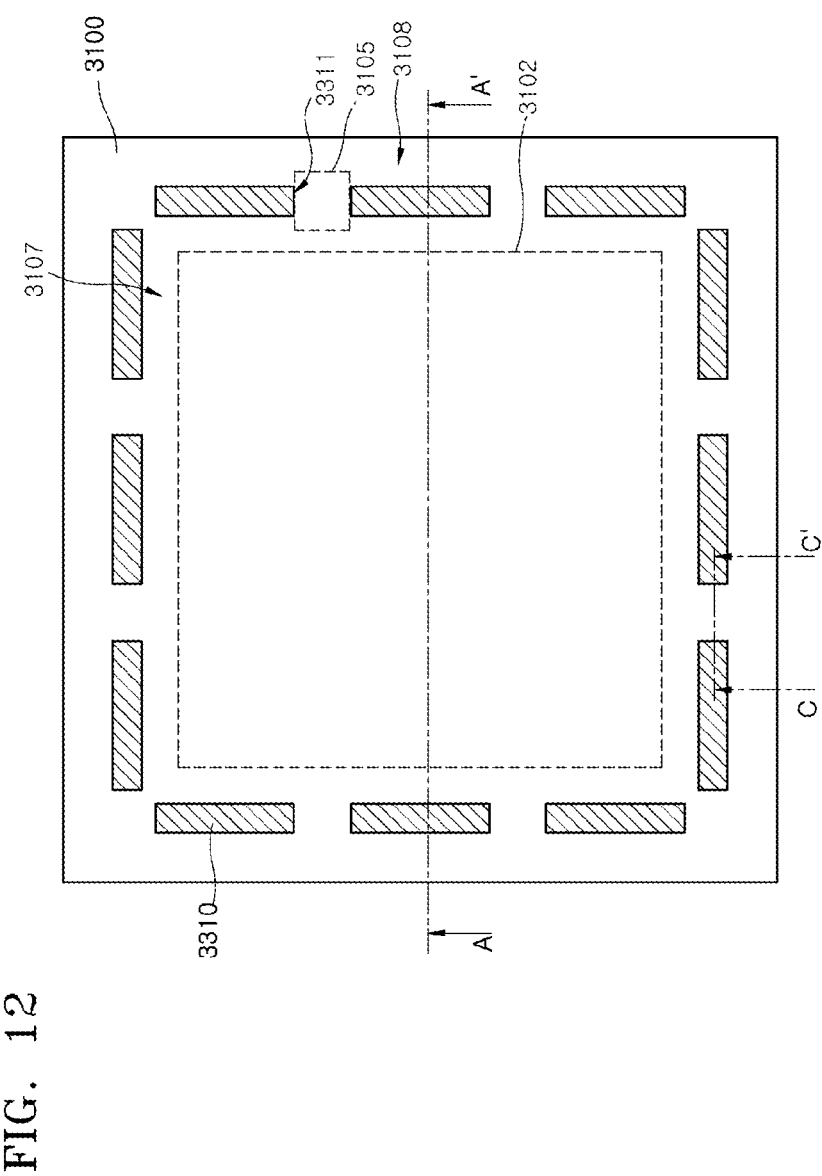
FIGS. 12 to 23 illustrate a representation of an example of a method of fabricating a semiconductor package according to an embodiment.
Figure 13:
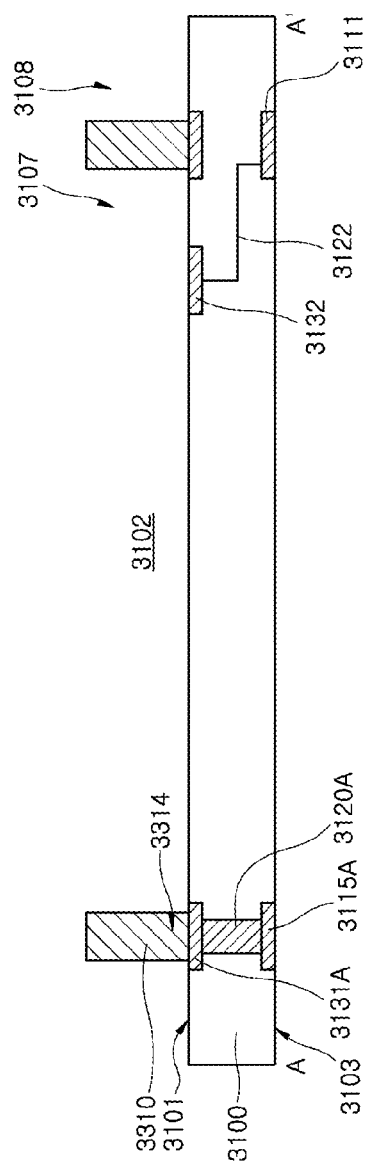
Figure 14:
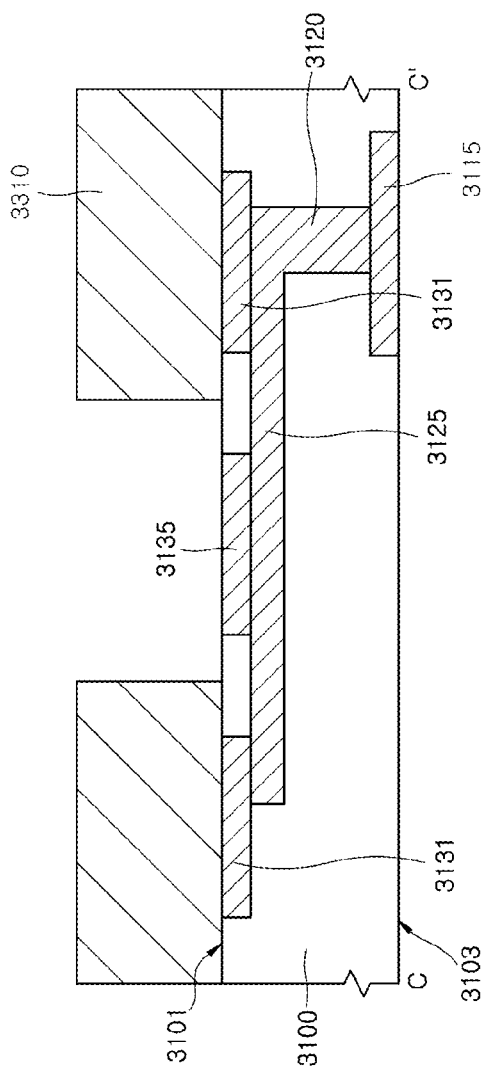

FIGS. 12 to 14 illustrate a step of forming an array of conductive walls 3310 on a package substrate 3100. FIG. 12 is a plan view illustrating the array of the conductive walls 3310. FIGS. 13 and 14 are cross-sectional views taken along a line A-A' and a line C-C' of FIG. 12, respectively. Referring to FIG. 12, the conductive walls 3310 may be formed on the package substrate 3100 to define a region 3102 on which a semiconductor device is mounted. The conductive walls 3310 may be formed to surround the region 3102. Each of the conductive walls 3310 may be formed to have two opposite end sidewalls 3311, and the conductive walls 3310 may be formed so that the end sidewalls 3311 of the conductive walls 3310 face to each other. The conductive walls 3310 may be spaced apart from each other to provide regions 3105 therebetween, and conductive pillars may be formed in the regions 3105 in a subsequent process, respectively. The conductive walls 3310 may be arrayed to provide a boundary between an inner region 3107 and an outer region 3108. Each of the conductive walls 3310 may be formed to have a bar shape that extend in one direction, and the conductive walls 3310 may be arrayed in a closed loop line.

Referring to FIG. 13, the conductive walls 3310 may be formed on a first surface 3101 of the package substrate 3100 to have a certain height. Bottom portions 3314 of the conductive walls 3310 may be in contact with third landing pads 3131A disposed on the first surface 3101 of the package substrate 3100, respectively. The third landing pads 3131A may be portions of circuit traces disposed on and in the package substrate 3100. The conductive walls 3310 may be formed on the third landing pads 3131A using an electroplating process. The conductive walls 3310 may be formed of a conductive material including copper or copper alloy.

Second ground patterns 3115A corresponding to portions of the circuit traces may be disposed on a second surface 3103 of the package substrate 3100 opposite to the third landing pads 3131A. Each of the second ground patterns 3115A may be formed to have a shape of a pad to which a second ground connector (not illustrated) such as a solder ball is attached. The second ground connector may electrically connect the second ground pattern 3115A to an external device. Second internal connectors 3120A may be disposed in the package substrate 3100 to connect the second ground patterns 3115A to the third landing pads 3131A. Each of the second internal connectors 3120A may substantially penetrate the package substrate 3100 to have a through via shape. Conductive pads 3132 may be formed on the first surface 3101 of the package substrate 3100, and the conductive pads 3132 may be electrically connected to a semiconductor device which is mounted on the region 3102 in a subsequent process. External connectors 3111 may be formed on the second surface 3103 of the package substrate 3100 to have a pad shape. The external connectors 3111 may be electrically connected to the conductive pads 3132 through third internal connectors 3122 formed in the package substrate 3100.

Referring to FIG. 14, first landing pads 3135 may be formed on the first surface 3101 of the package substrate 3100 to act as portions of the circuit traces. The first landing pads 3135 may be formed of conductive pads, and conductive pillars may be formed on the first landing pads 3135 in a subsequent process. The first landing pads 3135 may be exposed to the regions 3105 between the conductive walls 3310. First ground patterns 3115 may be formed on the second surface 3103 of the package substrate 3100 to act as portions of the circuit traces. The first ground patterns 3115 may be formed to have a pad shape, and first ground connectors such as solder balls may be attached to the first ground patterns 3115 in a subsequent process to electrically connect the first ground patterns 3115 to an external device. The first ground patterns 3115 may be connected to the first landing pads 3135 through first internal connectors 3120 and 3125 formed in the package substrate 3100. The first internal connectors 3120 and 3125 may be formed to include first internal extensions 3125 extending in a horizontal direction and first internal vias 3120 substantially penetrating the package substrate 3100 in a vertical direction to have a through via shape.

Second landing pads 3131 may be formed on the first surface 3101 of the package substrate 3100 to be adjacent to the first landing pads 3135. The second landing pads 3131 may be connected to the third landing pads 3131A or may be the same pads as the third landing pads 3131A. The second landing pads 3131 may be combined with the bottom portions 3314 of the conductive walls 3310. The first internal extensions 3125 may be formed to electrically connect the second landing pads 3131 to the first landing pads 3135. The circuit traces disposed on and in the package substrate 3100 may be formed of a metal material including copper or copper alloy.

Figure 15:
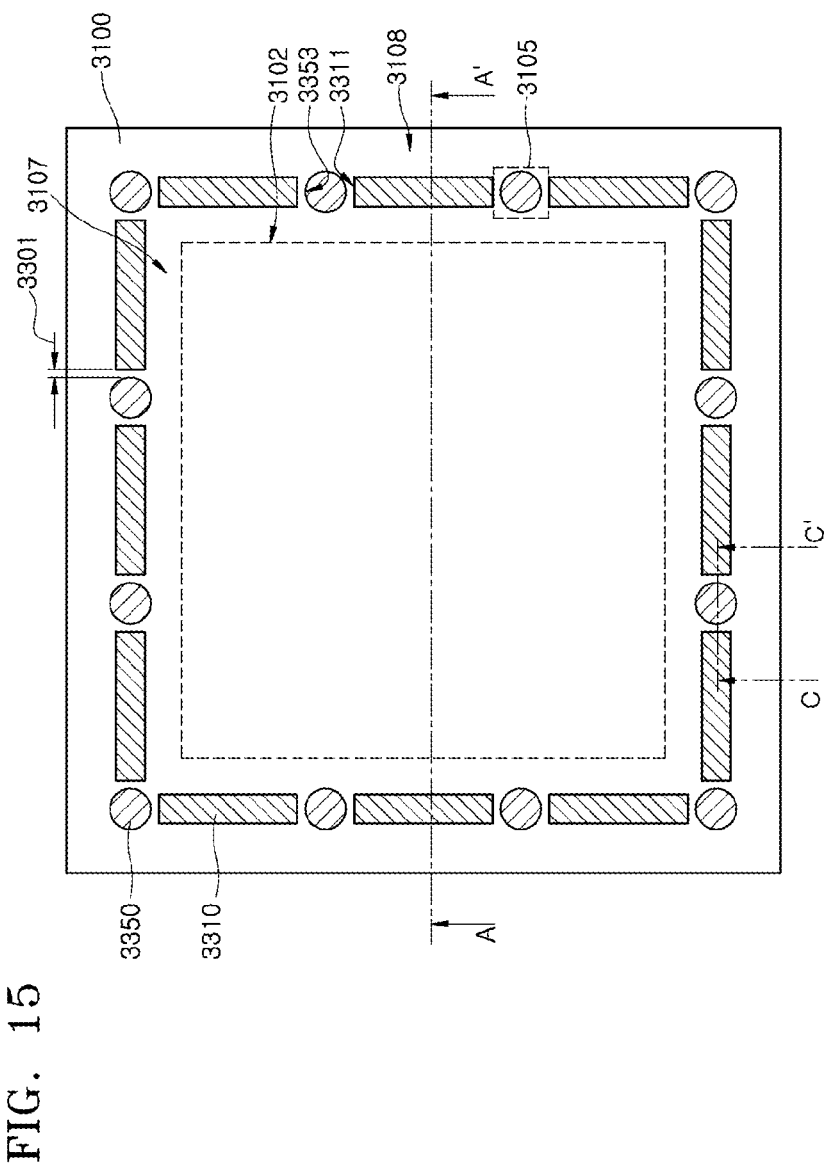
Figure 16:
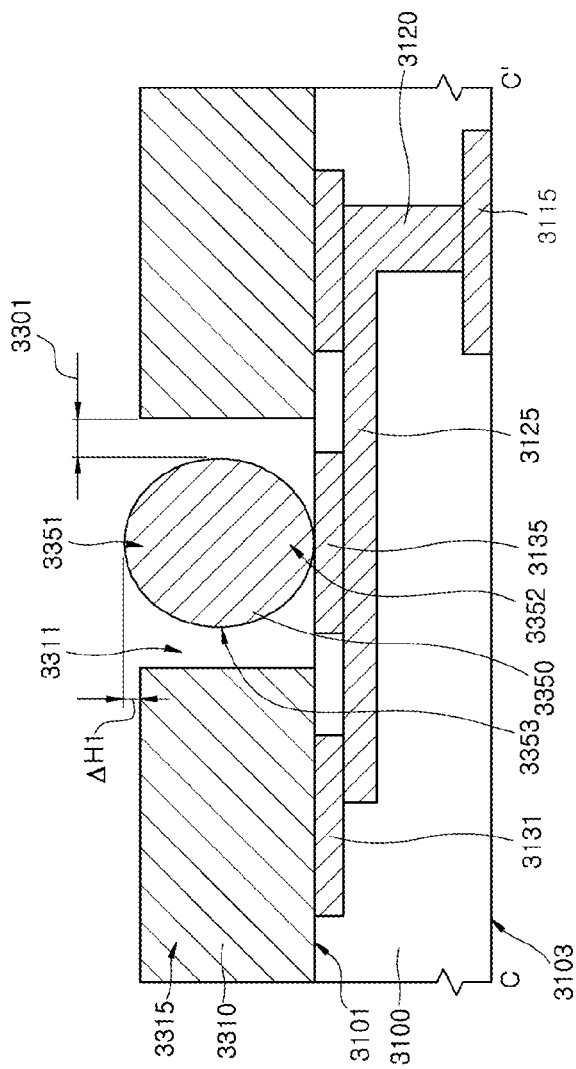

FIGS. 15 and 16 illustrate a step of forming conductive pillars 3350 on the package substrate 3100. FIG. 15 is a plan view illustrating the conductive pillars 3350, and FIG. 16 is a cross-sectional view taken along a line C-C' of FIG. 15. Referring to FIGS. 15 and 16, the conductive pillars 3350 may be attached to the first landing pads 3135, respectively. Each of the conductive pillars 3350 may be formed of a solder ball. Alternatively, each of the conductive pillars 3350 may be formed of a conductive material coated with a solder material. The conductive pillars 3350 may be formed in the regions 3105 between the conductive walls 3310, respectively. The conductive pillars 3350 may be formed on the first landing pads 3135 so that sidewalls 3353 of the conductive pillars 3350 are spaced apart from the end sidewalls 3311 of the conductive walls 3310. Spaces between the conductive pillars 3350 and the conductive walls 3310 may act as interconnecting tunnels 3301. The conductive walls 3310 and the conductive pillars 3350 may constitute a boundary between an inner region 3107 and an outer region 3108, and the interconnecting tunnels 3301 may act as paths that spatially connect the inner region 3107 to the outer region 3108.

Referring to FIG. 16, the conductive pillars 3350 may be disposed on the first landing pads 3135 so that top portions 3351 of the conductive pillars 3350 are located at a level which is higher than a level of top portions 3315 of the conductive walls 3310. As a result, a height difference ΔH1 may exist between the conductive pillar 3350 and the conductive wall 3310. The conductive pillars 3350, for example, solder balls may be combined with the first landing pads 3135 using a soldering process.

Figure 17:
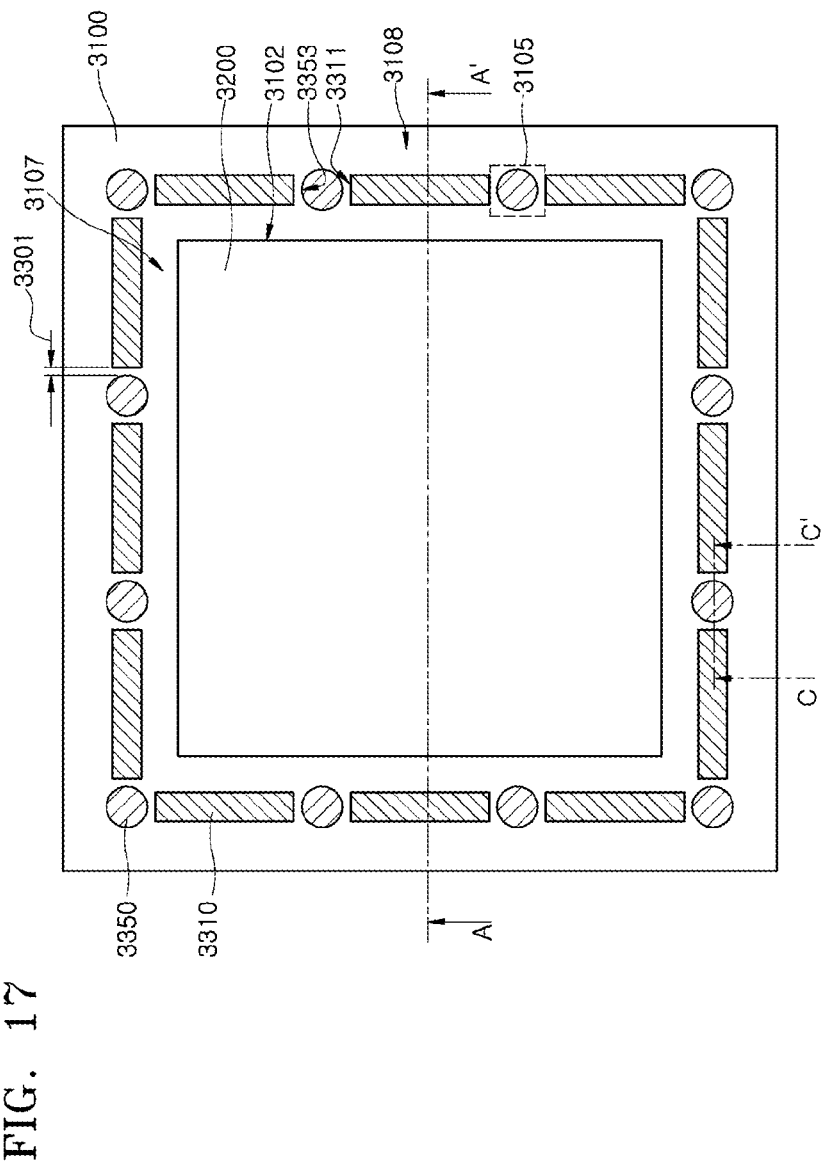
Figure 18:
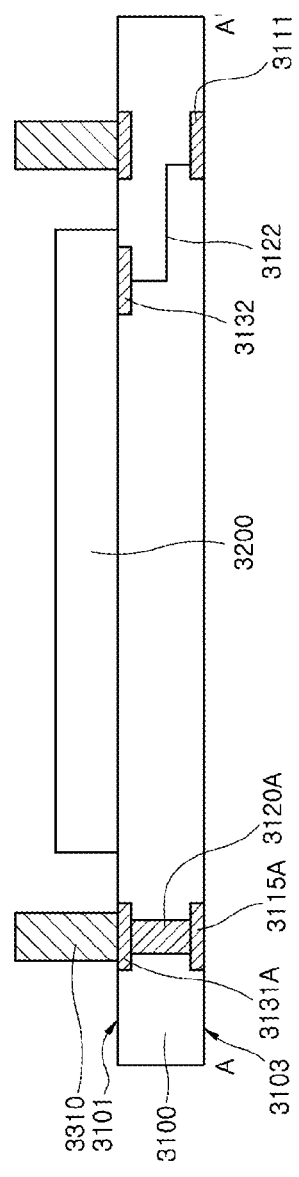

FIGS. 17 and 18 illustrate a step of mounting a semiconductor device 3200 on the package substrate 3100. FIG. 17 is a plan view illustrating the semiconductor device 3200 mounted on the package substrate 3100, and FIG. 18 is a cross-sectional view taken along a line A-A' of FIG. 17. Referring to FIGS. 17 and 18, the semiconductor device 3200 may be mounted on the region 3102 of the package substrate 3100 and may be electrically connected to the package substrate 3100. The semiconductor device 3200 may include a single semiconductor chip or a single semiconductor die. Alternatively, although not illustrated in the drawings, the semiconductor device 3200 may include a plurality of semiconductor chips or a plurality of semiconductor dies which are stacked. The plurality of stacked semiconductor chips or the plurality of stacked semiconductor dies may be electrically connected to the package substrate 3100 using bonding wires or bumps. The plurality of stacked semiconductor chips or the plurality of stacked semiconductor dies may be electrically connected to each other by through electrodes, for example, through silicon vias (TSVs).

Figure 19:
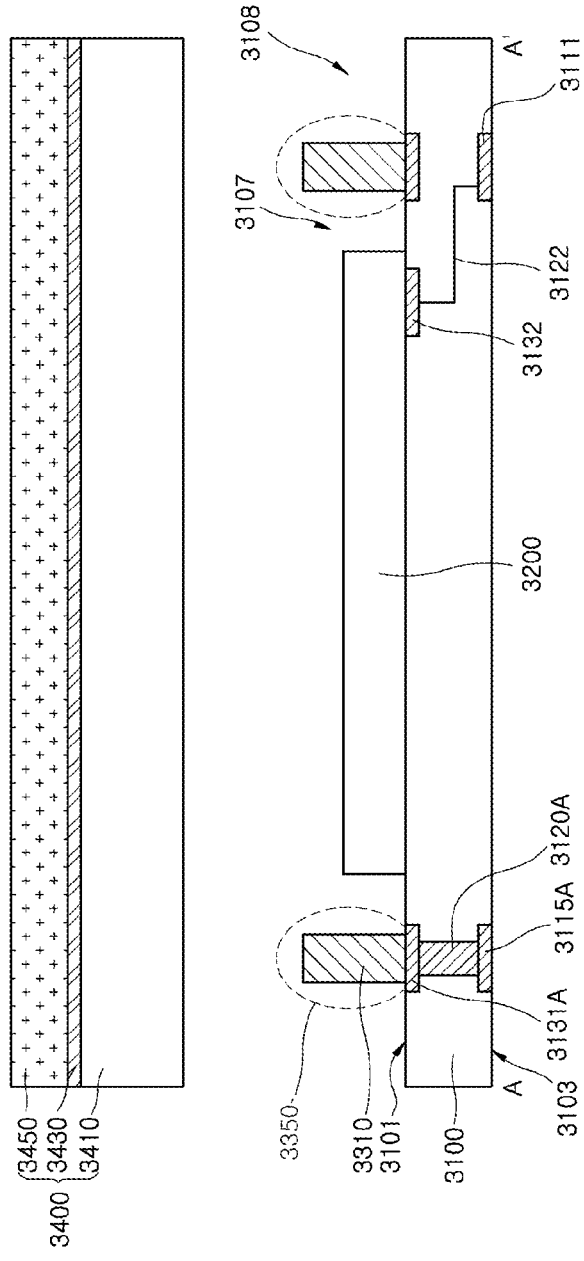

FIG. 19 illustrates a step of locating a stack sheet 3400 on the semiconductor device 3200. Referring to FIG. 19, the stack sheet 3400 may be provided to include a first dielectric layer 3410, a conductive roof 3430 and a second dielectric layer 3450 which are sequentially stacked, and the stack sheet 3400 may be put over the package substrate 3100 on which the semiconductor device 3200 is mounted. The first dielectric layer 3410 may include a dielectric material which is different from the second dielectric layer 3450. The conductive roof 3430 may be sandwiched between the first and second dielectric layers 3410 and 3450.

Figure 20:
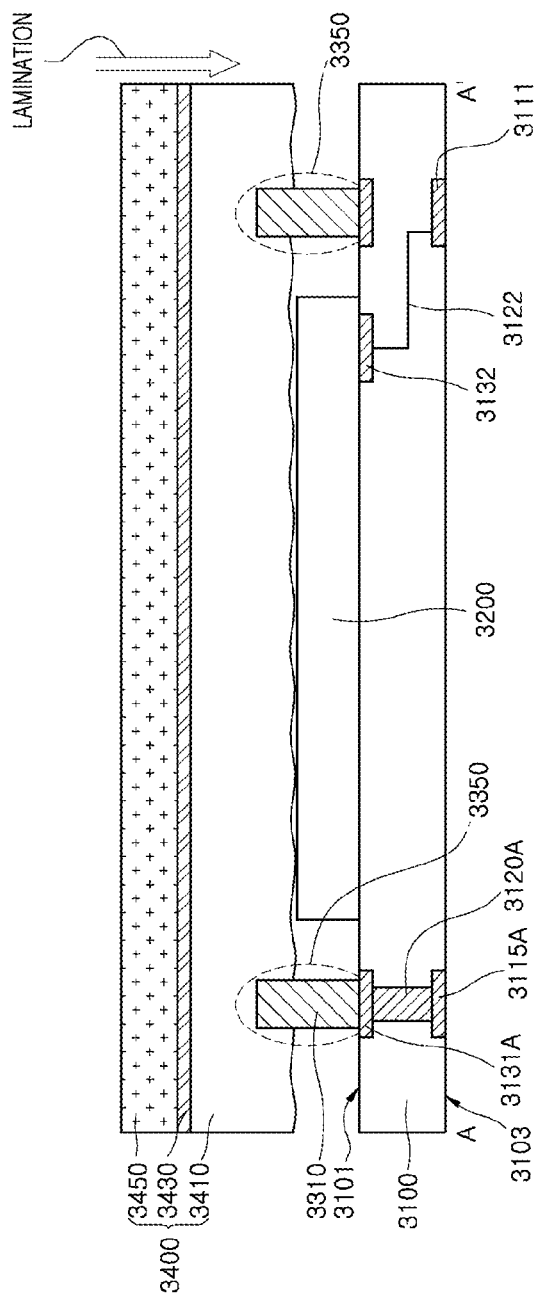

FIG. 20 illustrates a step of laminating the package substrate 3100 with the stack sheet 3400. Referring to FIG. 20, the stack sheet 3400 may be pressed down using a lamination process so that the package substrate 3100 including the semiconductor device 3200 is laminated with the first dielectric layer 3410. The lamination process for pressing the stack sheet 3400 may be performed using a rolling lamination technique, a compression lamination technique or a press lamination technique. The lamination process may be performed in vacuum at a temperature over a room temperature. The first dielectric layer 3410 may have a flowability at a temperature over a room temperature. Thus, during the lamination process, the conductive walls 3310 and the conductive pillars 3350 may infiltrate into the first dielectric layer 3410.

Figure 21:
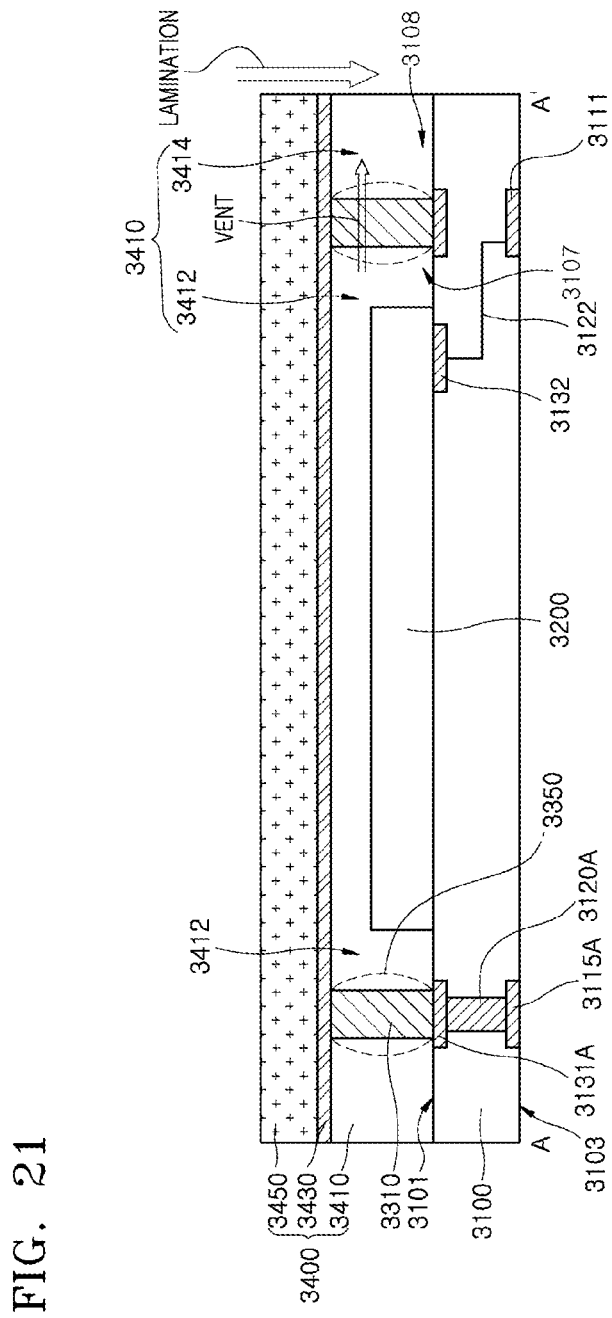
Figure 22:
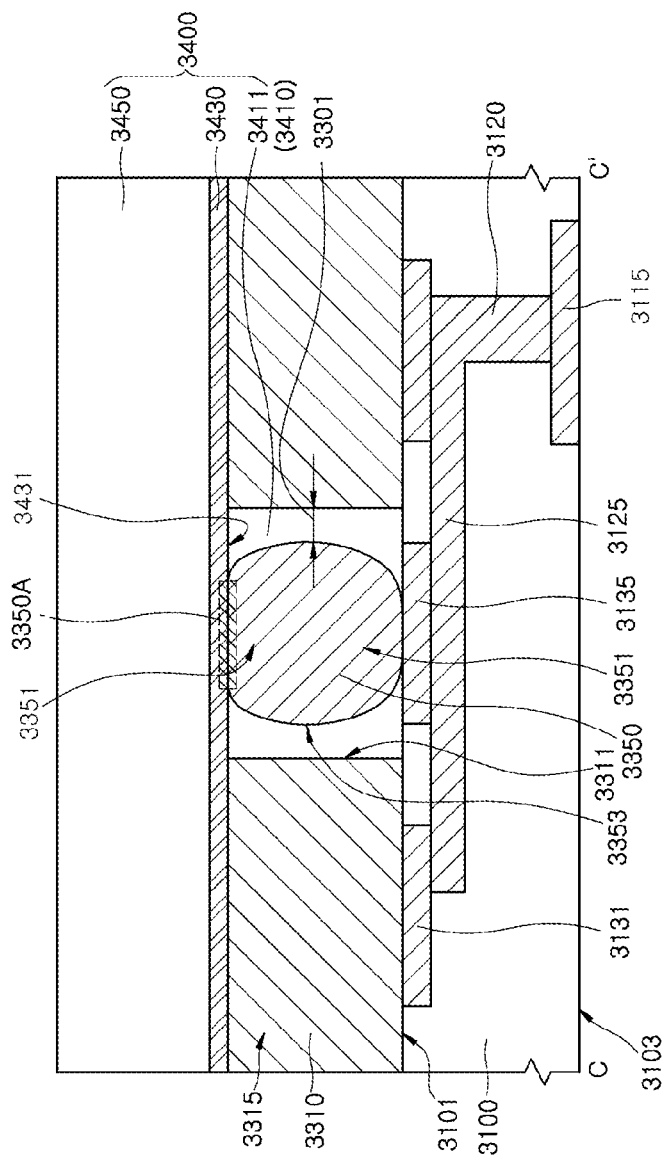
Figure 23:
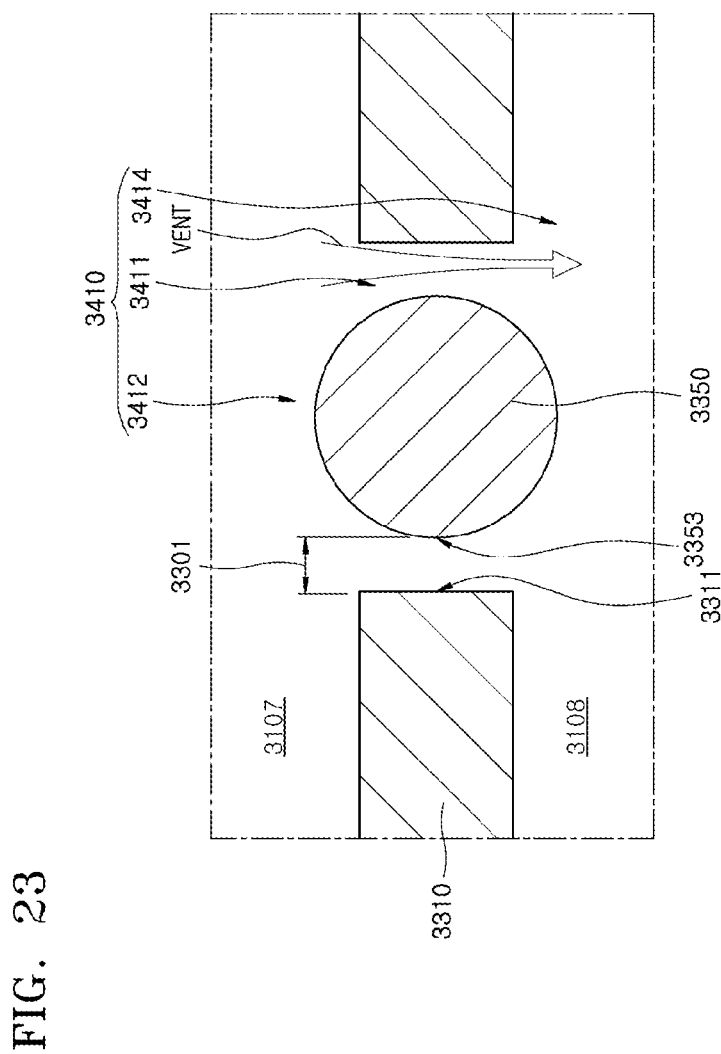

FIGS. 21, 22 and 23 illustrate a step of combining the conductive pillars 3350 with the conductive roof 3430 using the lamination process. Referring to FIGS. 21 and 22, while the lamination process is performed, the conductive pillars 3350 may be infiltrated into the first dielectric layer 3410 so that the top portions 3351 of the conductive pillars 3350 contact a bottom surface 3431 of the conductive roof 3430 located on the first dielectric layer 3410. During the lamination process, heat and pressure may be applied to the stack sheet 3400 and the conductive pillars 3350. Thus, a solder material contained in the conductive pillars 3350 may reflow during the lamination process. As a result, after the conductive roof 3430 contacts the top portions 3351 of the conductive pillars 3350, the conductive pillars 3350 may be deformed and a height of the conductive pillars 3350 may be reduced until the conductive roof 3430 contacts the top portions 3315 of the conductive walls 3310. In some cases, after the lamination process terminates, the conductive roof 3430 may not contact the top portions 3315 of the conductive walls 3310 to provide the gaps (1316D of FIG. 6) between the conductive roof 3430 and the conductive walls 3310, as illustrated in FIG. 6. In any event, a solder material contained in the conductive pillars 3350 may flow due to heat and pressure supplied from the lamination process to generate soldering combination between the conductive roof 3430 and the conductive pillars 3350. That is, soldering interfaces 3350A may be provided between the conductive roof 3430 and the conductive pillars 3350 to form reliable contact.

Referring to FIGS. 22 and 23, interconnecting tunnels 3301 corresponding to gap spaces may be provided between two opposite sidewalls 3353 of the conductive pillar 3350 and the end sidewalls 3311 of the conductive walls 3310 adjacent to the conductive pillar 3350. The interconnecting tunnels 3301 may act as paths through which a dielectric material of the first dielectric layer 3410 is vented from the inner region 3107 into the outer region 3108 while the lamination process is performed. If a first portion 3412 of the first dielectric layer 3410 located in the inner region 3107 overflows due to the pressure supplied from the lamination process, the first portion 3412 of the first dielectric layer 3410 may flow into the outer region 3108 through the interconnecting tunnels 3301 to be merged into a second portion 3414 of the first dielectric layer 3410 located in the outer region 3108. Since the first dielectric layer 3410 can be vented through the interconnecting tunnels 3301, fall of the conductive walls 3310 may be prevented even though pressure is applied to the first dielectric layer 3410 during the lamination process. That is, during the lamination process, the pressure applied to the conductive walls 3310 through the first dielectric layer 3410 may be remarkably relieved or alleviated due to the presence of the interconnecting tunnels 3301. Accordingly, the interconnecting tunnels 3301 may suppress a process failure that the conductive walls 3310 fall down during the lamination process. If the conductive walls 3310 fall down, the conductive roof 3430 may be electrically disconnected from the conductive walls 3310. In such a case, the conductive roof 3430 may be unstably grounded to degrade the EMI shielding effect of the conductive roof 3430. However, fall of the conductive walls 3310 may be suppressed due to the presence of the interconnecting tunnels 3301 during the lamination process, as described above. Thus, the EMI shielding effect of the conductive roof 3430 may be improved.

Subsequently, an engraving process for forming an identification mark (1457 of FIG. 5) on the second dielectric layer 3450 may be performed using a laser beam, as described with reference to FIG. 5.

FIGS. 24 to 30 illustrate a representation of an example of a method of fabricating a semiconductor package according to an embodiment.

Figure 24:
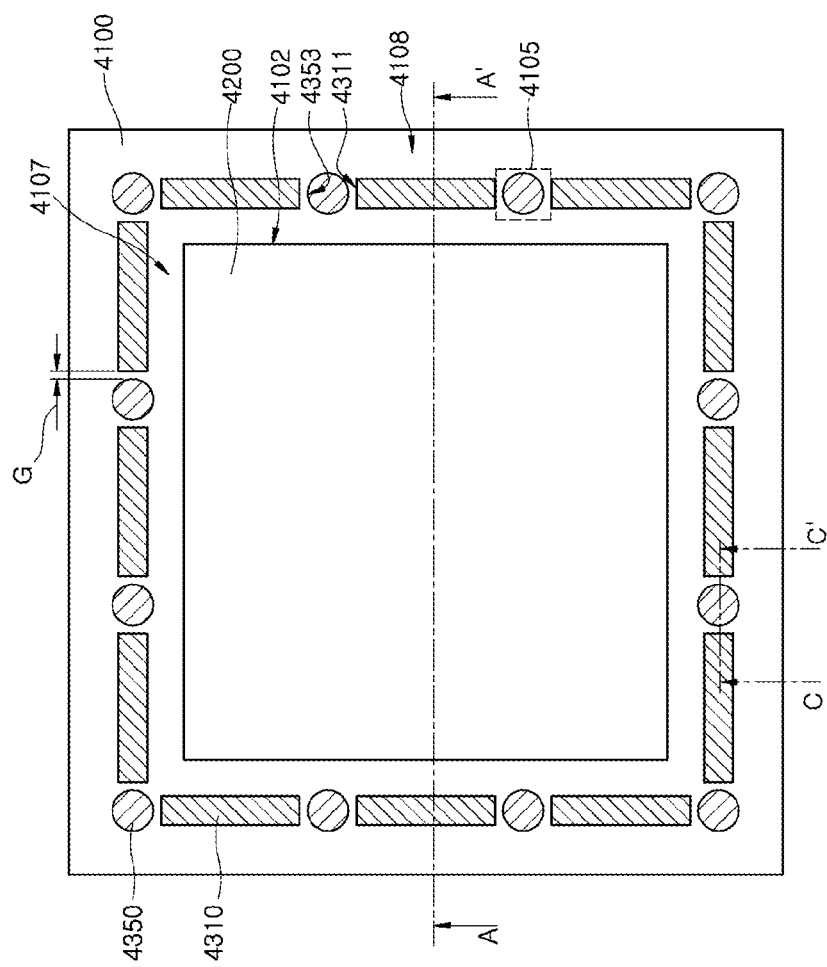
FIGS. 24 to 30 illustrate a representation of an example of a method of fabricating a semiconductor package according to an embodiment.
Figure 25:
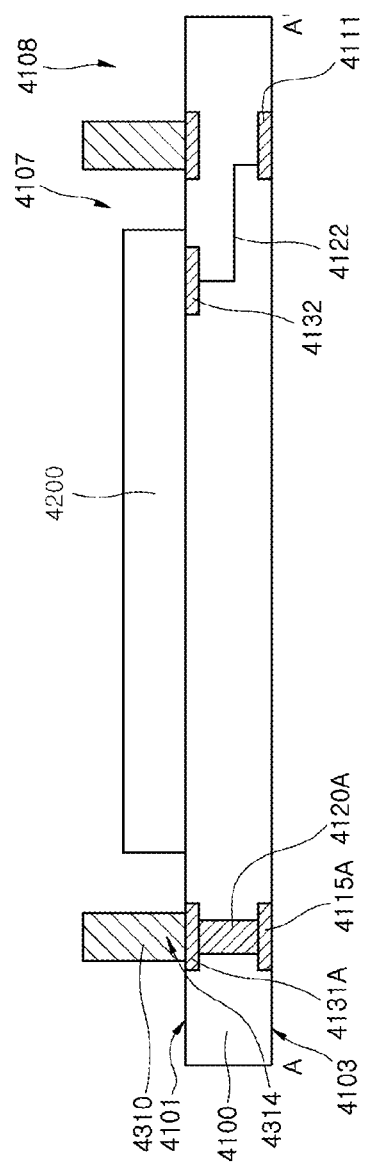
Figure 26:
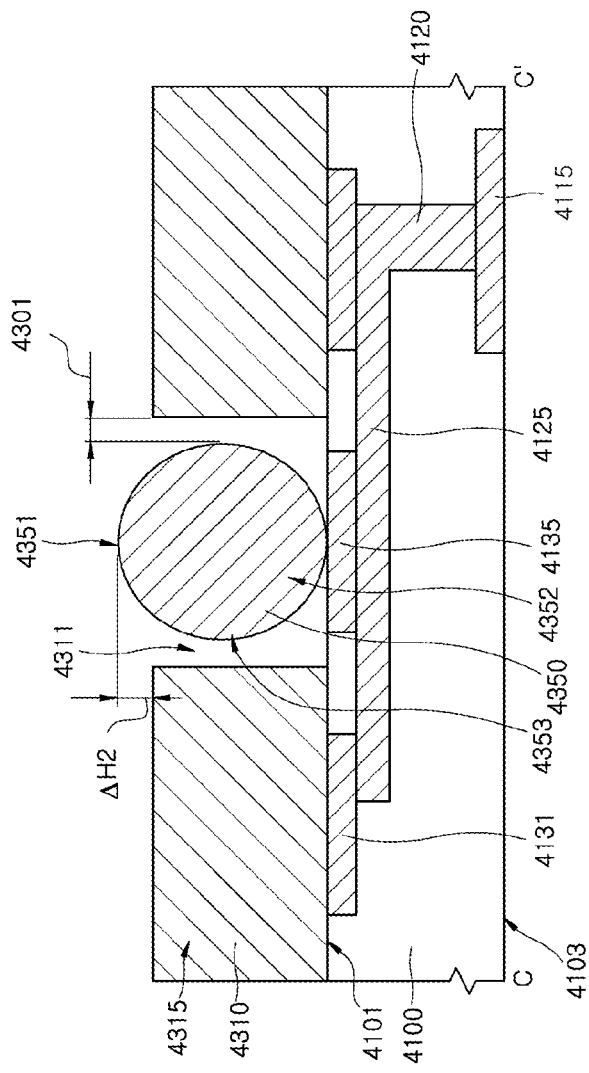

FIGS. 24 to 26 illustrate a step of forming conductive walls 4310 and conductive pillars 4350 on a package substrate 4100. FIG. 24 is a plan view illustrating the conductive walls 4310 and the conductive pillars 4350. FIGS. 25 and 26 are cross-sectional views taken along a line A-A' and a line C-C' of FIG. 24, respectively.

Referring to FIG. 25, the conductive walls 4310 may be formed on the package substrate 4100 to define a region 4102 on which a semiconductor device 4200 is mounted. The conductive walls 4310 may be arrayed to surround the region 4102. Each of the conductive walls 4310 may be formed to have two opposite end sidewalls 4311, and the conductive walls 4310 may be arrayed so that the end sidewalls 4311 of the conductive walls 4310 face to each other. The conductive walls 4310 may be spaced apart from each other to provide regions 4105 therebetween, and the regions 4105 may provide positions on which the conductive pillars 4350 are disposed. The conductive walls 4310 may be arrayed to provide a boundary between an inner region 4107 and an outer region 4108. Each of the conductive walls 4310 may be formed to have a bar shape that extend in one direction, and the conductive walls 4310 may be arrayed in a closed loop line.

Referring again to FIG. 25, the conductive walls 3310 may be formed on a first surface 4101 of the package substrate 4100 to have a certain height. Bottom portions 4314 of the conductive walls 4310 may be in contact with third landing pads 4131A disposed on the first surface 4101 of the package substrate 4100, respectively. The third landing pads 4131A may be portions of circuit traces disposed on and in the package substrate 4100. The conductive walls 4310 may be formed on the third landing pads 4131A using an electroplating process. The conductive walls 4310 may be formed of a conductive material including copper or copper alloy.

Second ground patterns 4115A corresponding to portions of the circuit traces may be disposed on a second surface 4103 of the package substrate 4100 opposite to the third landing pads 4131A. Each of the second ground patterns 4115A may be formed to have a shape of a pad to which a second ground connector (not illustrated) such as a solder ball is attached. The second ground connector may electrically connects the second ground pattern 4115A to an external device. Second internal connectors 4120A may be disposed in the package substrate 4100 to connect the second ground patterns 4115A to the third landing pads 4131A. Each of the second internal connectors 4120A may substantially penetrate the package substrate 4100 to have a through via shape. Conductive pads 4132 may be formed on the first surface 4101 of the package substrate 4100, and the conductive pads 4132 may be electrically connected to the semiconductor device 4200 which is mounted on the region 4102. External connectors 4111 may be formed on the second surface 4103 of the package substrate 4100 to have a pad shape. The external connectors 4111 may be electrically connected to the conductive pads 4132 through third internal connectors 4122 formed in the package substrate 4100.

Referring to FIG. 26, first landing pads 4135 may be formed on the first surface 4101 of the package substrate 4100 to act as portions of the circuit traces. The first landing pads 4135 may be formed of conductive pads, and the conductive pillars 4350 may be formed on the first landing pads 4135, respectively. The first landing pads 4135 may be formed to be exposed to the regions 4105 between the conductive walls 4310. First ground patterns 4115 may be formed on the second surface 4103 of the package substrate 4100 to act as portions of the circuit traces. The first ground patterns 4115 may be formed to have a pad shape, and first ground connectors such as solder balls may be attached to the first ground patterns 4115 in a subsequent process to electrically connect the first ground patterns 4115 to an external device. The first ground patterns 4115 may be connected to the first landing pads 4135 through first internal connectors 4120 and 4125 formed in the package substrate 4100. The first internal connectors 4120 and 4125 may be formed to include first internal extensions 4125 extending in a horizontal direction and first internal vias 4120 substantially penetrating the package substrate 4100 in a vertical direction to have a through via shape.

Second landing pads 4131 may be formed on the first surface 4101 of the package substrate 4100 to be adjacent to the first landing pads 4135. The second landing pads 4131 may be connected to the third landing pads 4131A or may be the same pads as the third landing pads 4131A. The second landing pads 4131 may be combined with the bottom portions 4314 of the conductive walls 4310. The first internal extensions 4125 may be formed to electrically connect the second landing pads 4131 to the first landing pads 4135. The circuit traces disposed on and in the package substrate 4100 may be formed of a metal material including copper or copper alloy.

Referring to FIGS. 24 and 26, the conductive pillars 4350 may be formed on the package substrate 4100. Specifically, the conductive pillars 4350 may be attached to the first landing pads 4135, respectively. Each of the conductive pillars 4350 may be formed of a solder ball. Alternatively, each of the conductive pillars 4350 may be formed of a conductive material coated with a solder material. The conductive pillars 4350 may be formed in the regions 4105 between the conductive walls 4310, respectively. The conductive pillars 4350 may be formed on the first landing pads 4135 so that sidewalls 4353 of the conductive pillars 4350 are spaced apart from the end sidewalls 4311 of the conductive walls 4310. Gap spaces G between the conductive pillars 4350 and the conductive walls 4310 may act as interconnecting tunnels 4301.

Referring to FIG. 26, the conductive pillars 4350 may be disposed on the first landing pads 4135 so that top portions 4351 of the conductive pillars 4350 are located at a level which is higher than a level of top portions 4315 of the conductive walls 4310. As a result, a height difference ΔH2 may exist between the conductive pillar 4350 and the conductive wall 4310. The conductive pillars 4350, for example, solder balls may be combined with the first landing pads 4135 using a soldering process.

Referring to FIGS. 24 and 25, the semiconductor device 4200 may be mounted on the region 4102 of the package substrate 4100 and may be electrically connected to the package substrate 4100.

Figure 27:
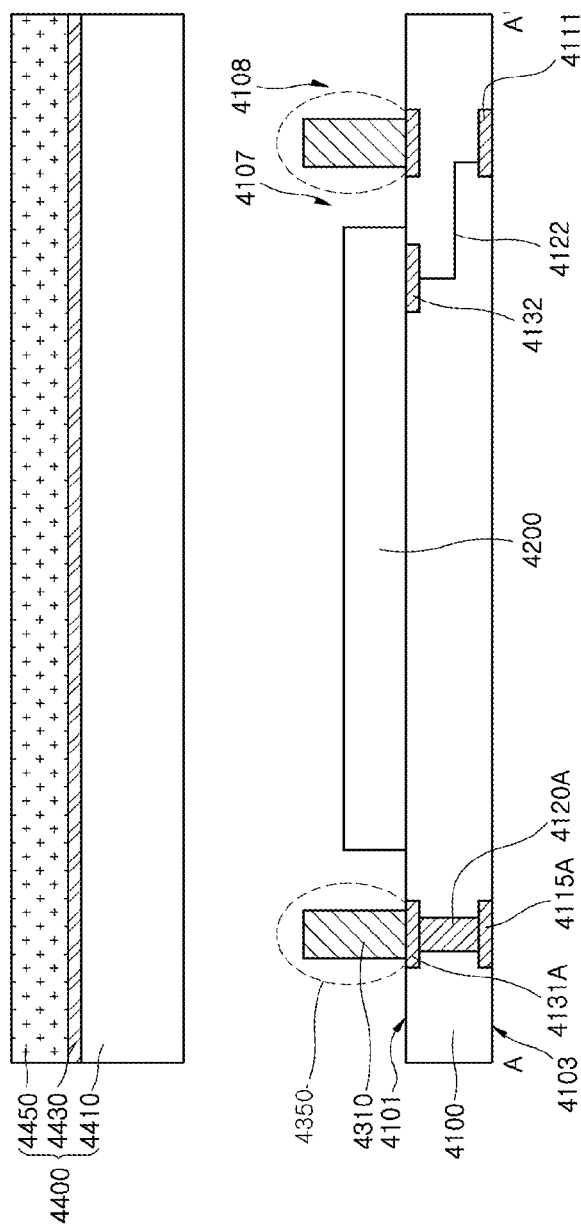

FIG. 27 illustrates a step of locating a stack sheet 4400 on the semiconductor device 4200. Referring to FIG. 27, the stack sheet 4400 may be provided to include a first dielectric layer 4410, a conductive roof 4430 and a second dielectric layer 4450 which are sequentially stacked, and the stack sheet 4400 may be put over the package substrate 4100 on which the semiconductor device 4200 is mounted. The first dielectric layer 4410 may include a dielectric material which is different from the second dielectric layer 4450.

Figure 28:
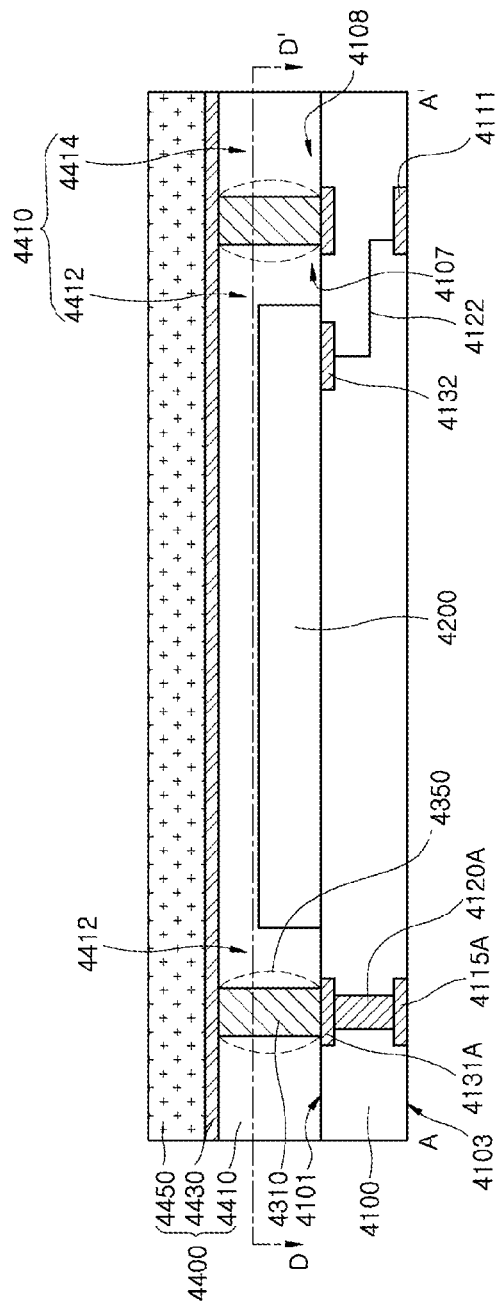
Figure 29:
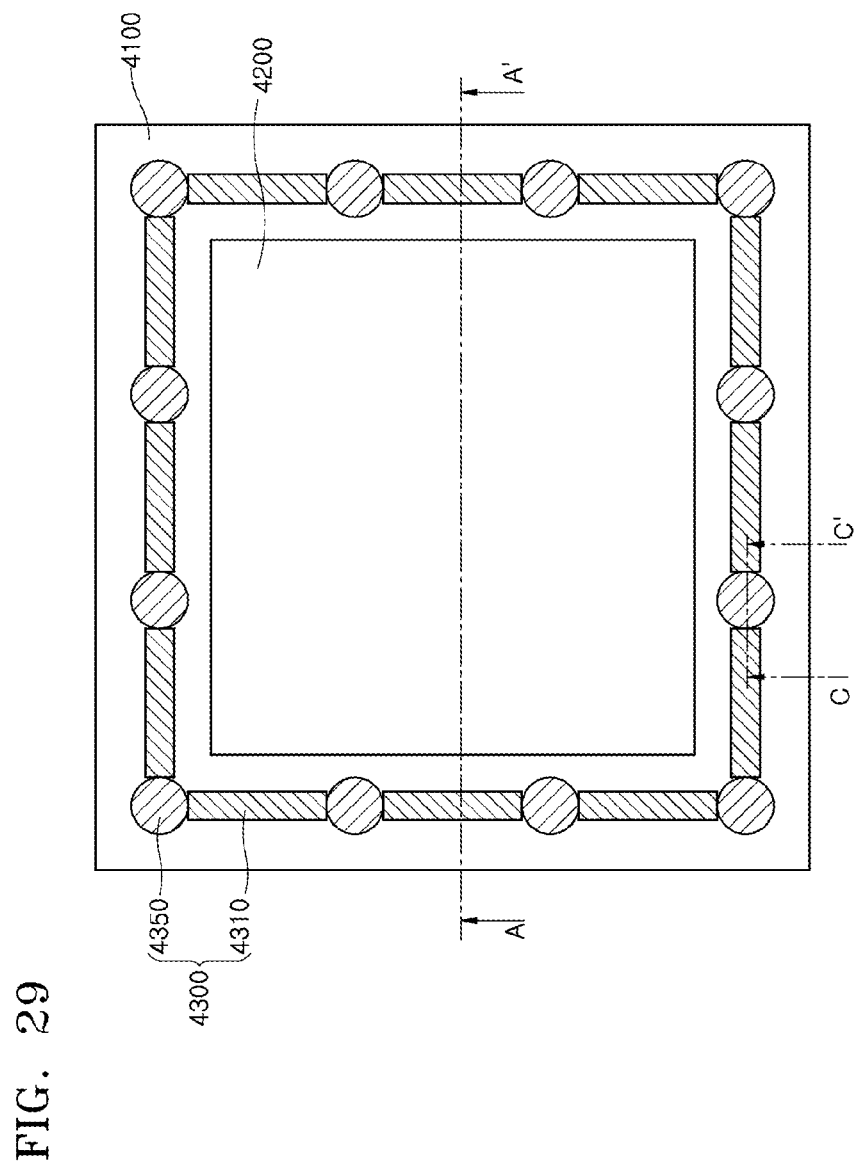
Figure 30:
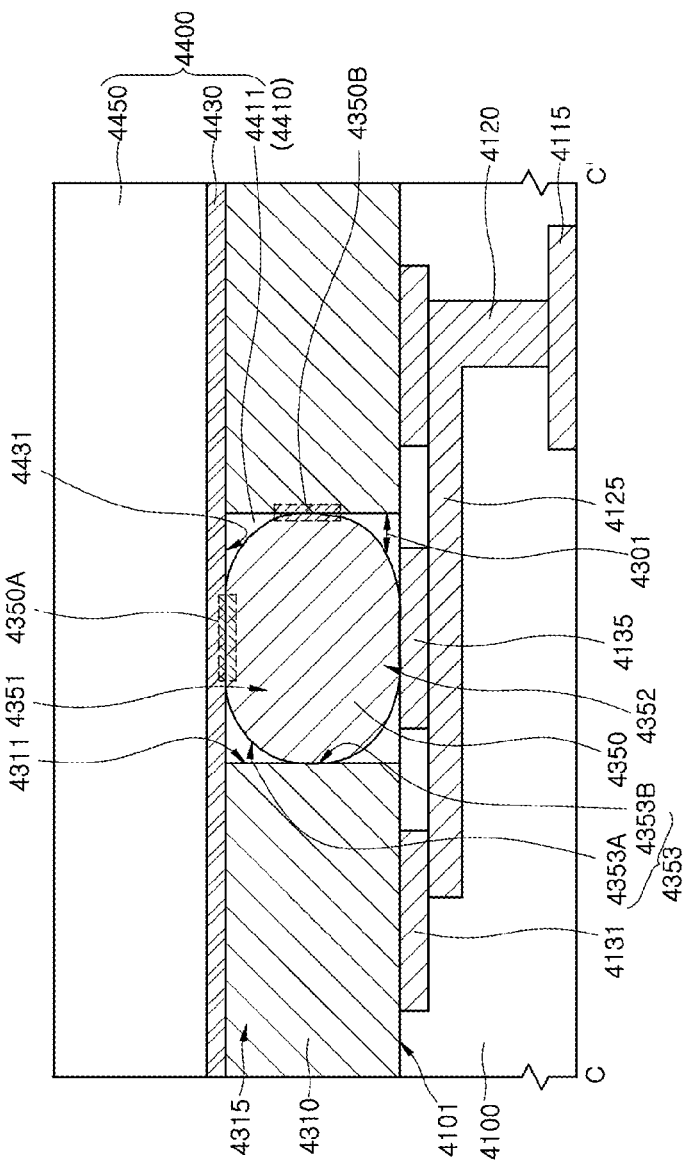

FIGS. 28, 29 and 30 illustrate a step of laminating the package substrate 4100 with the stack sheet 4400. FIG. 28 is a cross sectional view illustrating the package substrate 4100 laminated with the stack sheet 4400, and FIG. 29 is a plan view taken a line D-D' of FIG. 28. FIG. 30 is a cross-sectional view taken a line C-C' of FIG. 29. Referring to FIGS. 29 and 30, the stack sheet 4400 may be pressed down using a lamination process so that the package substrate 4100 including the semiconductor device 4200 is laminated with the first dielectric layer 4410. The lamination process for pressing the stack sheet 4400 may be performed in vacuum at a temperature over a room temperature. The first dielectric layer 4410 may have a flowability at a temperature over a room temperature. Thus, during the lamination process, the conductive walls 4310 and the conductive pillars 4350 may infiltrate into the first dielectric layer 4410.

While the lamination process is performed, the conductive pillars 4350 may be infiltrated into the first dielectric layer 4410 so that the top portions 4351 of the conductive pillars 4350 contact a bottom surface 4431 of the conductive roof 4430 located on the first dielectric layer 4410. During the lamination process, heat and pressure may be applied to the stack sheet 4400 and the conductive pillars 4350. Thus, a solder material contained in the conductive pillars 4350 may reflow during the lamination process. As a result, after the conductive roof 4430 contacts the top portions 4351 of the conductive pillars 4350, the conductive pillars 4350 may be deformed and a height of the conductive pillars 4350 may be reduced. Accordingly, soldering combination may be provided between the conductive roof 4430 and the conductive pillars 4350. That is, soldering interfaces 4350A may be provided between the conductive roof 4430 and the conductive pillars 4350 to form reliable contact.

Since the conductive pillars 4350 are pressed down during the lamination process, the conductive pillars 4350 may expand in a horizontal direction. As a result, while a first sidewall portion 4353A of each sidewall 4353 of the conductive pillar 4350 is still spaced apart from the end sidewall 4311 of the conductive pillar 4310, a second sidewall portion 4353B of each sidewall 4353 of the conductive pillar 4350 may be in contact with and combined with the end sidewall 4311 of the conductive pillar 4310. A space between the end sidewall 4311 of the conductive wall 4310 and the first sidewall portion 4353A of the conductive pillar 4350 adjacent thereto may correspond to an interconnecting tunnel 4301. The end sidewall 4311 of the conductive wall 4310 and the second sidewall portion 4353B of the conductive pillar 4350 may contact each other to provide a soldering interface corresponding to a bridge portion 4350B. An entire portion or sidewall portions of the conductive pillar 4350 may include a solder material. Thus, the bridge portion 4350B may be formed by combining the conductive wall 4310 with the conductive pillar 4350 using a soldering process. The bridge portion 4350B may be located at a mid-level of the sidewall 4353 of the conductive pillar 4350. In such a case, four interconnecting tunnels 4301 may be provided in four spaces between the conductive pillar 4350 and the pair of adjacent conductive walls 4310, respectively. Two of the interconnecting tunnels 4301 may be located on and under the bridge portion 4350B, respectively.

The conductive walls 4310 and the conductive pillars 4350 may constitute a boundary between the inner region (4107 of FIG. 24) and the outer region (4108 of FIG. 24), and the interconnecting tunnels 4301 may act as paths that spatially connect the inner region 4107 to the outer region 4108. The first portion 4412 of the first dielectric layer 4410 located in the inner region 4107 and the second portion 4414 of the first dielectric layer 4410 located in the outer region 4108 may be connected to each other by extension portions 4411 of the first dielectric layer 4410 filling the interconnecting tunnels 4301. That is, the interconnecting tunnels 4301 may act as venting paths through which a material of the first dielectric layer 4410 flows from the inner region 4107 into the outer region 4108 or from the outer region 4108 into the inner region 4107 during the lamination process.

While the lamination process is performed, the bottom surface 4431 of the conductive roof 4430 may contact the top portions 4315 of the conductive walls 2310. In some cases, gaps (2316D of FIG. 11) may be provided between the conductive roof 4430 and the conductive walls 4310, as described with reference to FIG. 11.

Subsequently, an engraving process for forming an identification mark (1457 of FIG. 5) on the second dielectric layer 4450 may be performed using a laser beam, as described with reference to FIG. 5.

Figure 31:
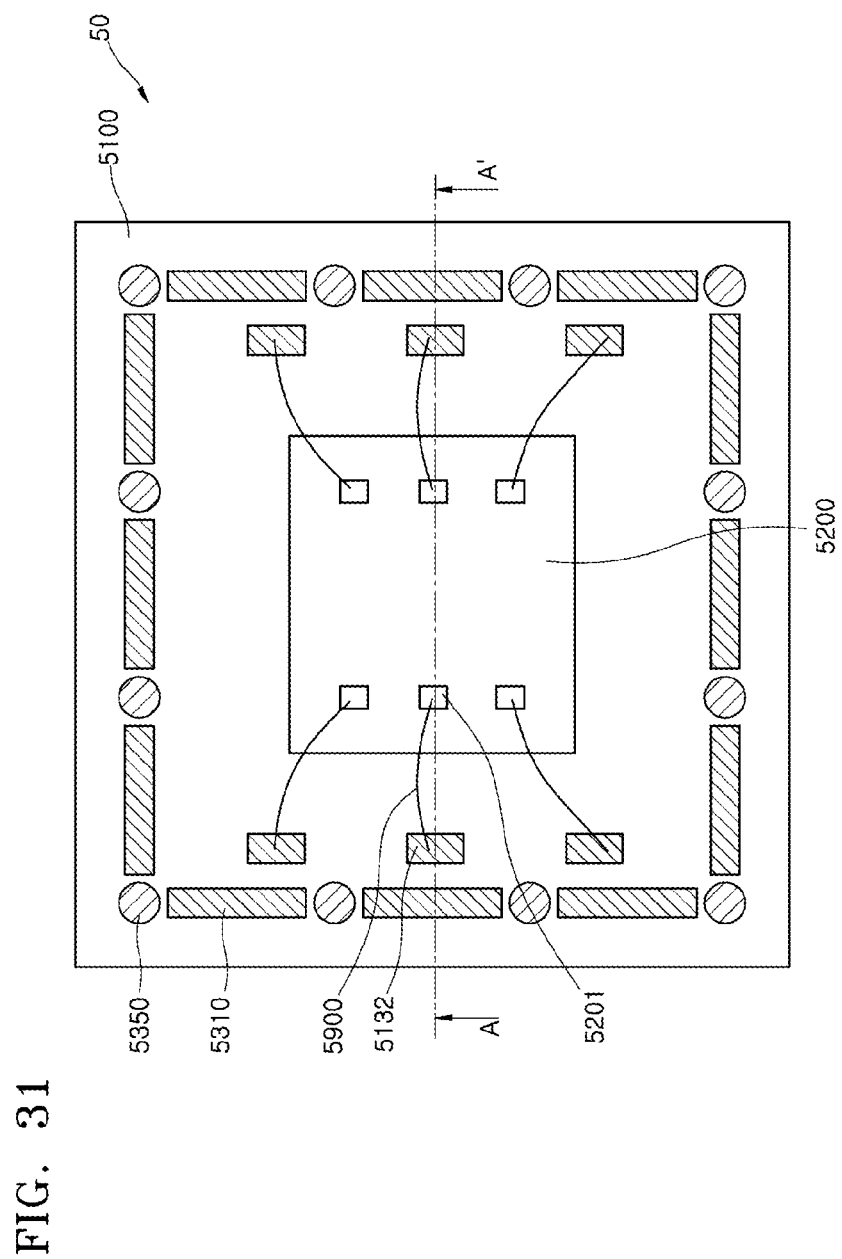
FIGS. 31 and 32 illustrate a representation of an example of a semiconductor package according to an embodiment.
Figure 32:
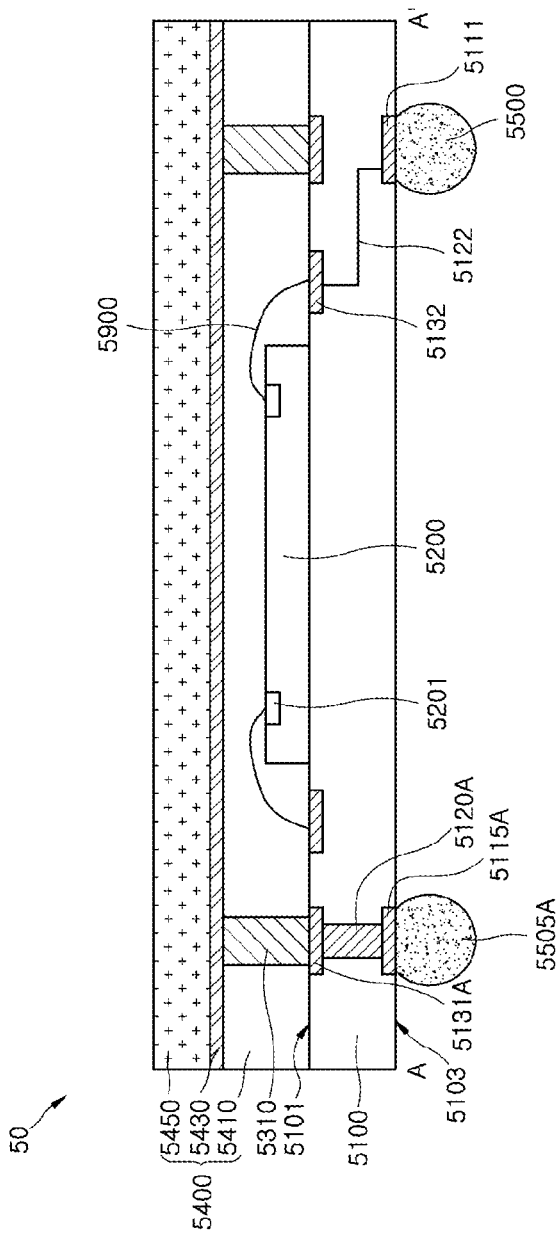

FIGS. 31 and 32 illustrate a semiconductor package 50 according to an embodiment. FIG. 31 is a plan view illustrating the semiconductor package 50, and FIG. 32 is a cross-sectional view taken a line A-A' of FIG. 31. FIGS. 31 and 32 illustrate an example in which the semiconductor package 50 employs a bonding wire interconnection structure.

Referring to FIGS. 31 and 32, the semiconductor package 50 may include a package substrate 5100 and a semiconductor device 5200 mounted on the package substrate 5100. In addition, the semiconductor package 50 may be configured to include an EMI shielding part which is comprised of conductive walls 5310, conductive pillars 5350 and a conductive roof 5430. The conductive walls 5310, the conductive pillars 5350 and the conductive roof 5430 constituting the EMI shielding part may enclose the semiconductor device 5200 to shield the semiconductor device 5200 from EMI.

A first dielectric layer 5410 may cover the semiconductor device 5200 mounted on the package substrate 5100 to function as a protection layer of the semiconductor device 5200. The conductive walls 5310 may be embedded in the first dielectric layer 5410. For example, sidewalls of the conductive walls 5310 may be surrounded by the first dielectric layer 5410. Thus, the first dielectric layer 5410 may prevent the conductive walls 5310 from being exposed to external environment of the semiconductor package 50. The first dielectric layer 5410, the conductive roof 5430 and a second dielectric layer 5450 may be sequentially stacked to constitute a stack sheet 5400, and the stack sheet 5400 may be configured to protect the semiconductor device 5200.

Referring to FIG. 32, the conductive walls 5310 may be connected to circuit traces disposed on a first surface 5101 and in a body of the package substrate 5100. The conductive walls 5310 may be in contact with third landing pads 5131A that are disposed on the first surface 5101 of the package substrate 5100 to correspond to portions of the circuit traces. Second ground patterns 5115A corresponding to portions of the circuit traces may be disposed on a second surface 5103 of the package substrate 5100 opposite to the third landing pads 5131A. The second ground patterns 5115A may have a pad shape, and second ground connectors 5505A such as solder balls may be disposed on the second ground patterns 5115A to electrically connect the second ground patterns 5115A to an external device. Second internal connectors 5120A may be disposed in the package substrate 5100 to connect the second ground patterns 5115A to the third landing pad 5131A. The second internal connectors 5120A may substantially penetrate the package substrate 5100.

Referring again to FIGS. 31 and 32, the semiconductor device 5200 mounted on the first surface 5101 of the package substrate 5100 may be electrically connected to the package substrate 5100 using a wire bonding process. Conductive landing pads 5132 may be disposed on the first surface 5101 of the package substrate 5100 and may be connected to bonding wires 5900. The landing pads 5132 may be disposed on a peripheral region of the package substrate 5100 not to overlap with the semiconductor device 5200. Conductive contact pads 5201 may be disposed on a top surface of the semiconductor device 5200. The contact pads 5201 may be arrayed on edges of the semiconductor device 5200 in an edge pad array form.

The bonding wires 5900 may be disposed to electrically connect the contact pads 5201 of the semiconductor device 5200 to the landing pads 5132 of the package substrate 5100. The landing pads 5132 may be electrically connected to external connectors 5111 that are disposed on the second surface 5103 of the package substrate 5100. Third internal connectors 5122 may be disposed in the package substrate 5100 to electrically connect the external connectors 5111 to the landing pads 5132. Connectors 5500, for example, solder balls may be attached to the external connectors 5111 to electrically connect the external connectors 5111 to an external device.

The semiconductor device 5200 may include a semiconductor chip or a semiconductor die. Although not illustrated in the drawings, the semiconductor device 5200 may include a plurality of semiconductor chips or a plurality of semiconductor dies which are stacked. The plurality of stacked semiconductor chips or the plurality of stacked semiconductor dies may be electrically connected to the package substrate 5100 using bonding wires. The package substrate 5100 may be a printed circuit board (PCB). In some embodiments, the package substrate 5100 may be a flexible substrate that can warp or bend.

Figure 33:
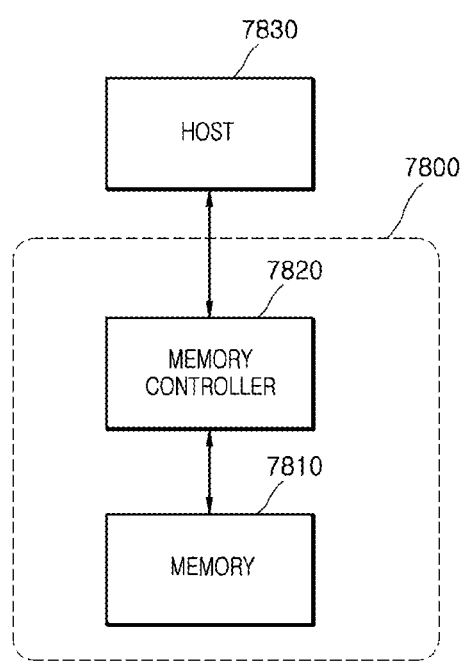
FIG. 33 is a block diagram illustrating a representation of an example of an electronic system employing a memory card including a package according to an embodiment.

FIG. 33 is a block diagram illustrating a representation of an example of an electronic system including a memory card 7800 including at least one semiconductor package according to an embodiment. The memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in a semiconductor package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 34:
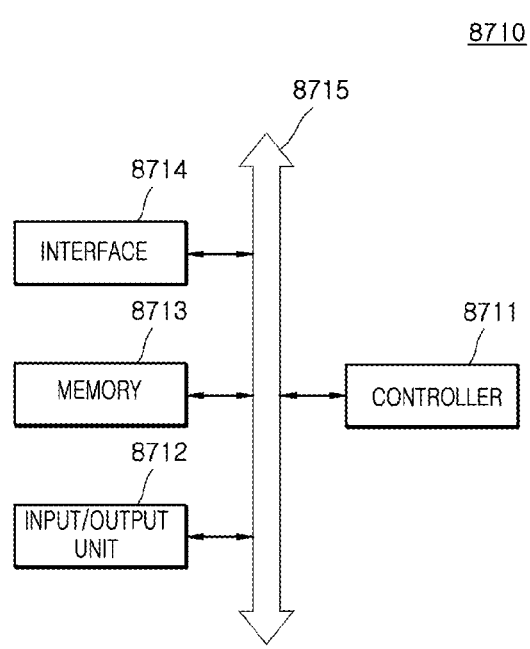
FIG. 34 is a block diagram illustrating a representation of an example of an electronic system including a package according to an embodiment.

FIG. 34 is a block diagram illustrating a representation of an example of an electronic system 8710 including at least one package according to an embodiment. The electronic system 8710 may include a controller 8711, an input/output device 8712, and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a semiconductor device mounted on a package substrate;
a conductive roof located over the semiconductor device;
a plurality of conductive walls disposed on the package substrate and arrayed to surround the semiconductor device;
conductive pillars disposed on the package substrate and bonded to the conductive roof, the plurality of conductive pillars being disposed in regions between the conductive walls to provide interconnecting tunnels corresponding to spaces between the conductive walls and the conductive pillars;
a first dielectric layer filling a space between the package substrate and the conductive roof;
first landing patterns disposed on a first surface of the package substrate and combined with bottom portions of the conductive pillars;
first ground patterns disposed on a second surface of the package substrate opposite to the first landing patterns; and
first internal connectors electrically connecting the first landing patterns to the first ground patterns.

2. The semiconductor package of claim 1, wherein the conductive roof, the conductive walls and the conductive pillars constitute an electromagnetic interference (EMI) shielding part substantially enclosing the semiconductor device.

3. The semiconductor package of claim 1, further comprising a second dielectric layer covering a surface of the conductive roof opposite to the first dielectric layer and including a visible dye.

4. The semiconductor package of claim 3, wherein the second dielectric layer includes an epoxy molding compound (EMC) containing a carbon black material.

5. The semiconductor package of claim 3, wherein sidewalls of the second dielectric layer are vertically aligned with sidewalls of the first dielectric layer, respectively.

6. The semiconductor package of claim 1, wherein the conductive roof includes copper or copper alloy.

7. The semiconductor package of claim 1, wherein each of the conductive walls is a metal bar extending in one direction and is disposed to have a certain height from the package substrate.

8. The semiconductor package of claim 7, wherein the metal bar includes copper or copper alloy.

9. The semiconductor package of claim 8, wherein each of the conductive walls includes the metal bar and a diffusion barrier layer coated on an entire surface of the metal bar.

10. The semiconductor package of claim 1, wherein top portions of the conductive pillars are combined with a bottom surface of the conductive roof by a soldering interface.

11. The semiconductor package of claim 10, wherein the conductive pillars are solder balls.

12. The semiconductor package of claim 1, wherein top surfaces of the conductive pillars are substantially coplanar with top surfaces of the conductive walls.

13. The semiconductor package of claim 12, wherein top portions of the conductive walls are combined with the bottom surface of the conductive roof by a mechanical contact.

14. The semiconductor package of claim 1, wherein top surfaces of the conductive pillars are located at a level which is higher than a level of top surfaces of the conductive walls.

15. The semiconductor package of claim 14, wherein the first dielectric layer extends into spaces between a bottom surface of the conductive roof and the top portions of the conductive pillars.

16. The semiconductor package of claim 1, wherein the first dielectric layer includes extension portions that fill the interconnecting tunnels.

17. The semiconductor package of claim 1, wherein the conductive walls and the conductive pillars are grounded.

18. A semiconductor package comprising:
a semiconductor device mounted on a package substrate;
a conductive roof located over the semiconductor device;
a plurality of conductive walls disposed on the package substrate and arrayed to surround the semiconductor device;
conductive pillars disposed in regions between the conductive walls on the package substrate and bonded to the conductive roof, a first portion of a sidewall of each conductive pillar being combined with one of the conductive walls by a bridge portion and a second portion of a sidewall of each conductive pillar being spaced apart from one of the conductive walls to provide an interconnecting tunnel corresponding to a space; and
a first dielectric layer filling a space between the package substrate and the conductive roof.

19. A semiconductor package comprising:
a semiconductor device mounted on a package substrate;
a conductive roof located over the semiconductor device;
a plurality of conductive walls disposed on the package substrate and arrayed in a closed loop line surrounding the semiconductor device;
conductive pillars disposed in regions between the conductive walls on the package substrate and bonded to the conductive roof;
a first dielectric layer filling a space between the package substrate and the conductive roof;
first landing patterns disposed on a first surface of the package substrate and combined with bottom portions of the conductive pillars;
first ground patterns disposed on a second surface of the package substrate opposite to the first landing patterns; and
first internal connectors electrically connecting the first landing patterns to the first ground patterns.

* * * * *